(12) United States Patent
El-Hinnawy et al.

(10) Patent No.: US 10,833,004 B2
(45) Date of Patent: Nov. 10, 2020

(54) CAPACITIVE TUNING CIRCUIT USING RF SWITCHES WITH PCM CAPACITORS AND PCM CONTACT CAPACITORS

(71) Applicant: Newport Fab, LLC, Newport Beach, CA (US)

(72) Inventors: Nabil El-Hinnawy, Irvine, CA (US); Gregory P. Slovin, Irvine, CA (US); Jefferson E. Rose, Hawthorne, CA (US); David J. Howard, Irvine, CA (US)

(73) Assignee: Newport Fab, LLC dba Jazz Semiconductor, Newport Beach, CA (US)

( * ) Notice: Subject to any disclaimer, the term of this patent is extended or adjusted under 35 U.S.C. 154(b) by 0 days.

(21) Appl. No.: 16/247,225

(22) Filed: Jan. 14, 2019

(65) Prior Publication Data

US 2020/0058582 A1    Feb. 20, 2020

Related U.S. Application Data

(63) Continuation-in-part of application No. 16/231,121, filed on Dec. 21, 2018, and a continuation-in-part of
(Continued)

(51) Int. Cl.
*H01L 23/522* (2006.01)
*H01L 23/66* (2006.01)
*H01L 45/00* (2006.01)

(52) U.S. Cl.
CPC .......... *H01L 23/5223* (2013.01); *H01L 23/66* (2013.01); *H01L 45/06* (2013.01);
(Continued)

(58) Field of Classification Search
CPC . H01L 31/0735; H01L 45/06; H01L 45/1226; H01L 45/144; H01L 45/143;
(Continued)

(56) References Cited

U.S. PATENT DOCUMENTS 7,522,029 B1   4/2009  Lantz
8,314,983 B2  11/2012  Frank
(Continued)

FOREIGN PATENT DOCUMENTS

WO    WO 2016/028362    2/2016

OTHER PUBLICATIONS

G. Slovin, et al. "AIN Barriers for Capacitance Reduction in Phase-Change RF Switches," in *IEEE Electron Device Letters*, vol. 37, No. 5, pp. 568-571, May 2016.
(Continued)

*Primary Examiner* — Caridad Everhart
(74) *Attorney, Agent, or Firm* — Farjami & Farjami LLP

(57) ABSTRACT

A capacitive tuning circuit includes radio frequency (RF) switches connected to an RF line. Each RF switch includes a phase-change material (PCM), a heating element underlying an active segment of the PCM and extending outward and transverse to the PCM, and RF terminals having lower metal portions and upper metal portions. Alternatively, the RF terminals can have a trench metal liner separated from a trench metal plug by a dielectric liner. At least one capacitor is formed in part by at least one of the lower metal portions, upper metal portions, or trench metal liner. The capacitive tuning circuit can be set to a desired capacitance value when a first group of the RF switches is in an OFF state and a second group of the RF switches is in an ON state.

20 Claims, 14 Drawing Sheets

Related U.S. Application Data application No. 16/114,106, filed on Aug. 27, 2018, and a continuation-in-part of application No. 16/103,646, filed on Aug. 14, 2018, now Pat. No. 10,475,993, and a continuation-in-part of application No. 16/103,587, filed on Aug. 14, 2018, now Pat. No. 10,461,253, and a continuation-in-part of application No. 16/103,490, filed on Aug. 14, 2018, now Pat. No. 10,476,001.

(52) U.S. Cl.
CPC ........ *H01L 45/126* (2013.01); *H01L 45/1226* (2013.01); *H01L 45/143* (2013.01); *H01L 45/144* (2013.01)

(58) Field of Classification Search
CPC ... H01L 45/126; H01L 23/66; H01L 23/5223; H02S 40/22; H02S 40/38
See application file for complete search history.

(56) References Cited

U.S. PATENT DOCUMENTS

| | | | |
|---|---|---|---|
| 9,257,647 | B2 | 2/2016 | Borodulin |
| 9,362,492 | B2 | 6/2016 | Goktepeli |
| 9,368,720 | B1 | 6/2016 | Moon |
| 9,444,430 | B1 | 9/2016 | Abdo |
| 9,601,545 | B1 | 3/2017 | Tu |
| 9,640,759 | B1 | 5/2017 | Curioni |
| 9,891,112 | B1 | 2/2018 | Abel |
| 9,917,104 | B1 | 3/2018 | Roizin |
| 10,128,243 | B2 | 11/2018 | Yoo et al. |
| 10,164,608 | B2 | 12/2018 | Belot |
| 10,529,922 | B1 | 1/2020 | Howard |
| 2005/0127348 | A1 | 6/2005 | Horak |
| 2006/0246712 | A1 | 11/2006 | Kim |
| 2007/0075347 | A1 | 4/2007 | Lai |
| 2008/0142775 | A1 | 6/2008 | Chen |
| 2010/0084626 | A1 | 4/2010 | Delhougne |
| 2010/0238720 | A1 | 9/2010 | Tio Castro |
| 2011/0291784 | A1 | 12/2011 | Nakatsuji |
| 2013/0187120 | A1 | 7/2013 | Redaelli |
| 2013/0285000 | A1 | 10/2013 | Arai |
| 2014/0191181 | A1 | 7/2014 | Moon |
| 2014/0264230 | A1 | 9/2014 | Borodulin |
| 2014/0339610 | A1 | 11/2014 | Rashed |
| 2015/0048424 | A1 | 2/2015 | Tien |
| 2015/0090949 | A1 | 4/2015 | Chang |
| 2015/0333131 | A1 | 11/2015 | Mojumder |
| 2016/0035973 | A1 | 2/2016 | Raieszadeh |
| 2016/0056373 | A1* | 2/2016 | Goktepeli .......... H01L 45/1608 257/2 |
| 2016/0308507 | A1 | 10/2016 | Engelen |
| 2017/0092694 | A1 | 3/2017 | Brightsky |
| 2017/0126205 | A1 | 5/2017 | Lin |
| 2017/0187347 | A1 | 6/2017 | Rinaldi |
| 2017/0243861 | A1 | 8/2017 | Wang |
| 2017/0365427 | A1 | 12/2017 | Borodulin |
| 2018/0005786 | A1* | 1/2018 | Navarro .................. H01P 1/127 |
| 2018/0194615 | A1 | 7/2018 | Nawaz |
| 2018/0269393 | A1 | 9/2018 | Zhang |
| 2019/0064555 | A1 | 2/2019 | Hosseini |
| 2019/0067572 | A1 | 2/2019 | Tsai |
| 2019/0172657 | A1 | 6/2019 | Zhu |
| 2019/0267214 | A1 | 8/2019 | Liu |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

* cited by examiner

US 10,833,004 B2

CAPACITIVE TUNING CIRCUIT USING RF SWITCHES WITH PCM CAPACITORS AND PCM CONTACT CAPACITORS

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present application is further a continuation-in-part of and claims the benefit of and priority to application Ser. No. 16/231,121 filed on Dec. 21, 2018, titled "Phase-Change Material (PCM) Radio Frequency (RF) Switches with Capacitively Coupled RF Terminals,". The disclosures and contents of all of the above-identified applications are hereby incorporated fully by reference into the present application.

BACKGROUND

Given the ever-increasing reliance on radio frequency (RF) communication, there is particular need for RF tuning circuits. RF tuning circuits have utilized parallel plate capacitors and metal-oxide-semiconductor field-effect transistors (MOSFETs). However, these RF tuning circuits are typically adjustable only over a narrow range of capacitances, and cannot easily achieve a wide range of fine and coarse adjustment. Further, MOSFET capacitors are typically volatile, and also vary over time and/or with device temperature.

Thus, there is a need in the art for capacitive tuning circuits which allow non-volatile coarse and fine adjustments over a wide range of capacitances.

SUMMARY

The present disclosure is directed to a capacitive tuning circuit using RF switches with PCM capacitors and PCM contact capacitors, substantially as shown in and/or described in connection with at least one of the figures, and as set forth in the claims.

DETAILED DESCRIPTION

Figure 1A:
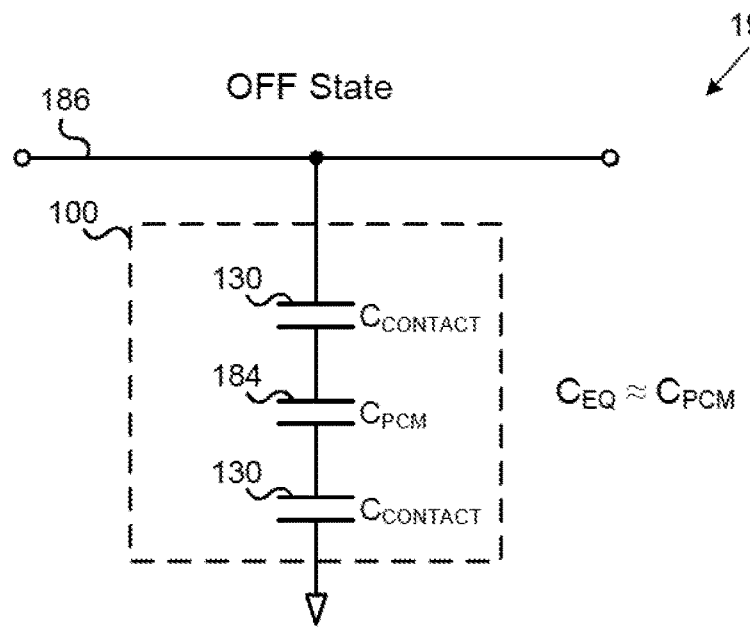
FIG. 1A illustrates a circuit model of a portion of a capacitive tuning circuit including a phase-change material (PCM) radio frequency (RF) switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A illustrates a circuit model of a portion of a capacitive tuning circuit including a phase-change material (PCM) radio frequency (RF) switch according to one implementation of the present application. Capacitive tuning circuit 190 in FIG. 1A includes RF line 186 and RF switch 100 having phase-change material (PCM) contact capacitors 130 and PCM capacitor 184. Capacitive tuning circuit 190 can be part of a matching network, filter, or other circuit. RF line 186 carries RF signals between any RF components, for example between an RF front end and an antenna element (not shown in FIG. 1A). RF switch 100 is coupled between RF line 186 and ground.

In FIG. 1A, RF switch 100 is in an OFF state, and includes PCM contact capacitors 130 and PCM capacitor 184 in series. As described below, PCM contact capacitors 130 are formed by capacitively coupled lower metal portions or capacitively coupled upper metal portions of RF terminals of RF switch 100. Also as described below, PCM capacitor 184 is formed by an amorphized active segment of PCM and passive segments of the PCM when RF switch 100 is in an OFF state.

RF switch 100 of capacitive tuning circuit 190 loads RF line 186 with a desired capacitance value based on the state of RF switch 100. When RF switch 100 is in an OFF state, the desired capacitance value is approximately equal to the value of PCM capacitor 184, as shown in Equations (1), (2), and (3) below. In Equations (1), (2), and (3), $C_{EQ}$ represents the equivalent capacitance of RF switch 100, $C_{CONTACT}$ represents the capacitance of one of PCM contact capacitors 130, and $C_{PCM}$ represents the capacitance of PCM capacitor 184. According to the formula for capacitors in series:

$$1/C_{EQ} = 1/C_{CONTACT} + 1/C_{PCM} + 1/C_{CONTACT} \quad \text{Equation (1)}.$$

Solving for $C_{EQ}$ yields:

$$C_{EQ} = (C_{CONTACT} * C_{PCM})/(2*C_{PCM} + C_{CONTACT}) \quad \text{Equation (2)}.$$

As described below, $C_{CM}$ is significantly smaller than $C_{CONTACT}$ (i.e., $C_{PCM} \ll C_{CONTACT}$), thus $C_{EQ}$ can be approximated:

$$C_{EQ} \approx (C_{CONTACT} * C_{PCM})/C_{CONTACT}$$

$$\approx C_{PCM} \quad \text{Equation (3)}.$$

Thus, RF switch 100 in an OFF state represents PCM capacitor 184. As described below, PCM capacitor 184 has a relatively small capacitance value. In one implementation, the capacitance value of PCM capacitor 184 can range from approximately one femto-Farad to approximately twenty femto-Farads (1 fF–20 fF). In the OFF state, RF switch 100 can use PCM capacitor 184 for fine tuning the capacitive load of capacitive tuning circuit 190.

Figure 1B:
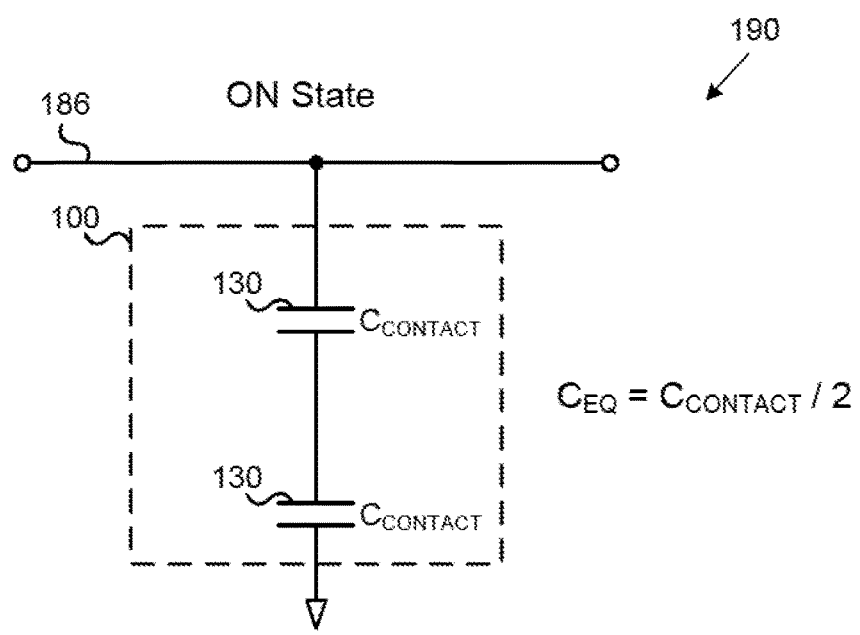
FIG. 1B illustrates a circuit model of a portion of a capacitive tuning circuit including a PCM RF switch corresponding to the circuit model of FIG. 1A.

FIG. 1B illustrates a circuit model of a portion of a capacitive tuning circuit including a PCM RF switch corresponding to the circuit model of FIG. 1A according to one implementation of the present application. FIG. 1B represents capacitive tuning circuit 190 when RF switch 100 is in an ON state. In FIG. 1B, RF switch 100 includes PCM contact capacitors 130 in series. Notably, RF switch 100 in FIG. 1B does not include a PCM capacitor, such as PCM capacitor 184 in FIG. 1A. As described below, PCM capacitor 184 is not formed when an active segment of PCM is crystalline and RF switch 100 is in an ON state.

RF switch 100 of capacitive tuning circuit 190 loads RF line 186 with a desired capacitance value based on the state of RF switch 100. When RF switch 100 is in an ON state, the desired capacitance value is equal to half the value of one of PCM contact capacitors 130, as shown in Equations (4) and (5) below. According to the formula for capacitors in series:

$$1/C_{EQ} = 1/C_{CONTACT} + 1/C_{CONTACT} \quad \text{Equation (4)}.$$

Solving for $C_{EQ}$ yields:

$$C_{EQ} = C_{CONTACT}/2 \quad \text{Equation (5)}.$$

Thus, RF switch 100 in an ON state represents PCM contact capacitors 130. As described below, PCM contact capacitors 130 have relatively large capacitance values. In one implementation, the capacitance value of one of PCM contact capacitors 130 can be at least one order of magnitude greater than the capacitance value of PCM capacitor 184. For example, the capacitance value of one of PCM contact capacitors 130 can be three orders of magnitude greater than the capacitance value of PCM capacitor 184, and measure on the scale of pico-Farads (pF). In the ON state. RF switch 100 can use PCM contact capacitors 130 for coarse tuning the capacitive load of capacitive tuning circuit 190.

Figure 2:
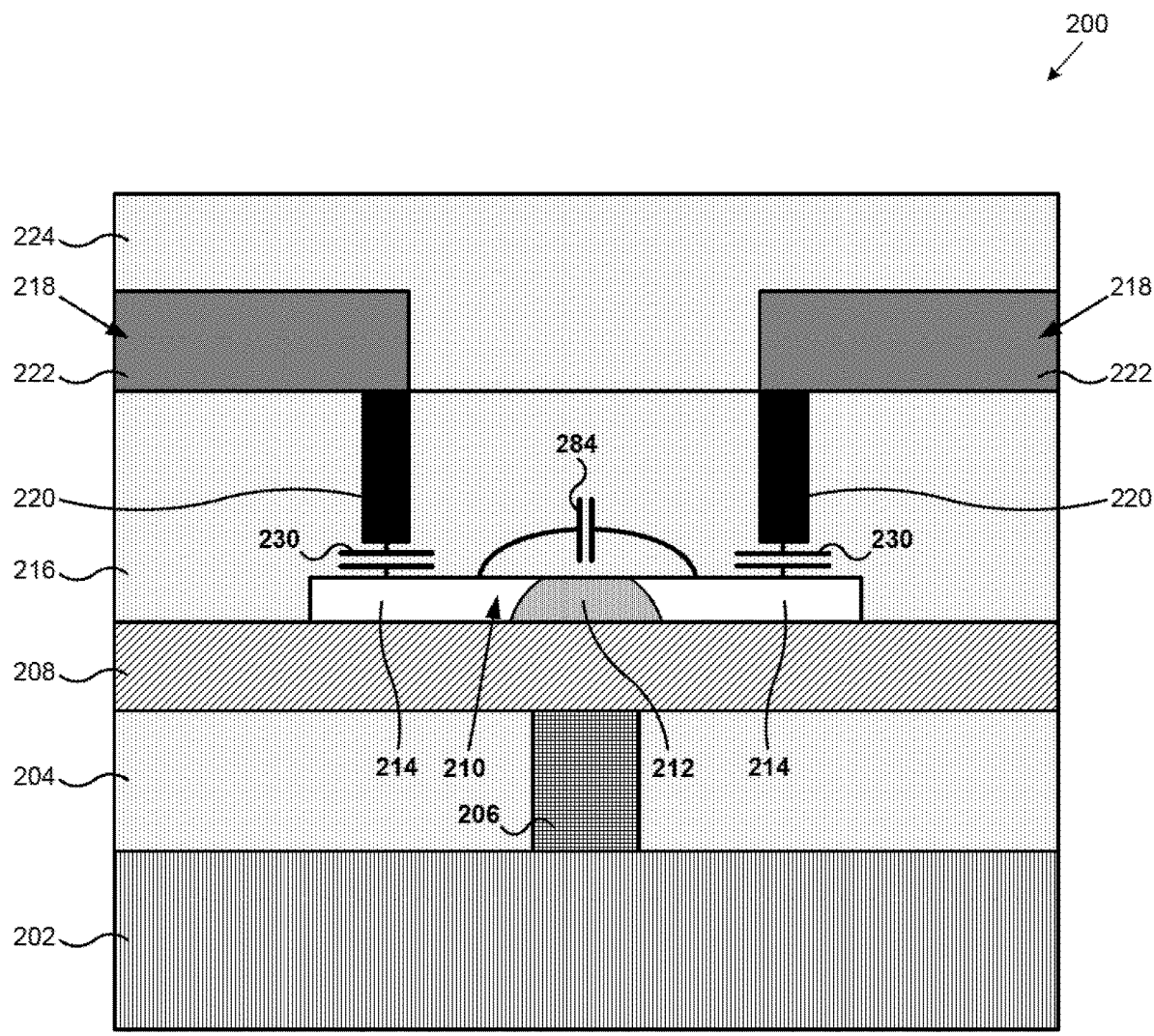
FIG. 2 illustrates a cross-sectional view of a portion of a PCM RF switch according to one implementation of the present application.

FIG. 2 illustrates a cross-sectional view of a portion of a PCM RF switch according to one implementation of the present application. RF switch 200 shown in FIG. 2 includes substrate 202, lower dielectric 204, heating element 206, thermally conductive and electrically insulating layer 208. PCM 210 having active segment 212 and passive segments 214, RF terminal dielectric segment 216, RF terminals 218 having lower metal portions 220 and upper metal portions 222, upper dielectric 224, and capacitors 230 and 284.

Substrate 202 is situated under lower dielectric 204. In one implementation, substrate 202 is an insulator, such as silicon oxide ($SiO_2$). In various implementations, substrate 202 is a silicon (Si), silicon-on-insulator (SOI), sapphire, complementary metal-oxide-semiconductor (CMOS), bipolar CMOS (BiCMOS), or group III-V substrate. In various implementations, a heat spreader is integrated with substrate 202, or substrate 202 itself performs as a heat spreader. Substrate 202 can have additional layers (not shown in FIG. 2). In one implementation, substrate 202 can comprise a plurality of interconnect metal levels and interlayer dielectric layers. Substrate 202 can also comprise a plurality of devices, such as integrated passive elements (not shown in FIG. 2).

Lower dielectric 204 is situated on top of substrate 202, and is adjacent to the sides of heating element 206. In the present implementation, lower dielectric 204 extends along the width of RF switch 200, and is also coplanar with heating element 206. In various implementations, lower dielectric 204 can have a relative width and/or a relative thickness greater or less than shown in FIG. 2. Lower dielectric 204 may comprise a material with thermal conductivity lower than that of thermally conductive and electrically insulating layer 208. In various implementations, lower dielectric 204 can comprise silicon oxide ($SiO_2$), silicon nitride ($Si_xN_y$), or another dielectric.

Heating element 206 is situated in lower dielectric 204. Heating element 206 also underlies active segment 212 of PCM 210. Heating element 206 generates a crystallizing heat pulse or an amorphizing heat pulse for transforming active segment 212 of PCM 210. Heating element 206 can comprise any material capable of Joule heating. Preferably, heating element 206 comprises a material that exhibits minimal or substantially no electromigration, thermal stress migration, and/or agglomeration. In various implementations, heating element 206 can comprise tungsten (W), molybdenum (Mo), titanium (Ti), titanium nitride (TiN), titanium tungsten (TiW), tantalum (Ta), nickel chromium (NiCr), or nickel chromium silicon (NiCrSi). For example, in one implementation, heating element 206 comprises tungsten lined with titanium and titanium nitride. Heating element 206 may be formed by a damascene process, a subtractive etch process, or any other suitable process. Heating element 206 can be connected to electrodes of a pulse generator (not shown in FIG. 2) that generates a crystallizing current pulse or an amorphizing voltage or current pulses.

Thermally conductive and electrically insulating layer 208 is situated on top of heating element 206 and lower dielectric 204, and under PCM 210 and, in particular, under active segment 212 of PCM 210. Thermally conductive and electrically insulating layer 208 ensures efficient heat transfer from heating element 206 toward active segment 212 of PCM 210, while electrically insulating heating element 206 from RF terminals 218, PCM 210, and other neighboring structures. Thermally conductive and electrically insulating layer 208 can comprise any material with high thermal conductivity and high electrical resistivity. In various implementations, thermally conductive and electrically insulating layer 208 can comprise aluminum nitride (AlN), aluminum oxide ($Al_xO_y$), beryllium oxide ($Be_xO_y$), silicon carbide (SiC), diamond, or diamond-like carbon.

PCM 210 is situated on top of thermally conductive and electrically insulating layer 208. PCM 210 also overlies heating element 206. PCM 210 includes active segment 212 and passive segments 214. Active segment 212 of PCM 210 approximately overlies heating element 206 and is approximately defined by heating element 206. Passive segments 214 of PCM 210 extend outward and are transverse to heating element 206, and are situated approximately under RF terminals 218. As used herein, "active segment" refers to a segment of PCM that transforms between crystalline and amorphous states, for example, in response to a crystallizing or an amorphizing heat pulse generated by heating element 206, whereas "passive segment" refers to a segment of PCM that does not make such transformation and maintains a crystalline state (i.e., maintains a conductive state). With proper heat pulses and heat dissipation, active segment 212 of PCM 210 can transform between crystalline and amorphous states, allowing RF switch 200 to switch between ON and OFF states respectively.

In the implementation of FIG. 2, RF switch 200 is illustrated in the OFF state. Active segment 212 is shaded to represent an amorphous segment of PCM 210 transformed in response to an amorphizing heat pulse generated by heating element 206. However, it should be understood that when RF switch 200 is in the ON state, active segment 212 can represent a crystalline segment of PCM 210.

PCM 210 can be germanium telluride ($Ge_xTe_y$), germanium antimony telluride ($Ge_xSb_yTe_z$), germanium selenide ($Ge_xSe_y$), or any other chalcogenide. In various implementations, PCM 210 can be germanium telluride having from forty percent to sixty percent germanium by composition (i.e., $Ge_xTe_y$, where $0.4 \leq X \leq 0.6$ and $Y=1-X$). The material for PCM 210 can be chosen based upon ON state resistivity, OFF state electric field breakdown threshold, crystallization temperature, melting temperature, or other considerations. PCM 210 can be provided, for example, by physical vapor deposition (PVD), sputtering, chemical vapor deposition (CVD), evaporation, or atomic layer deposition (ALD). It is noted that in FIG. 2, current flowing in heating element 206 flows substantially under active segment 212 of PCM 210.

RF terminal dielectric segment 216 is situated over PCM 210 and over thermally conductive and electrically insulating layer 208. In various implementations, RF terminal dielectric segment 216 is $SiO_2$, boron-doped $SiO_2$, phosphorous-doped $SiO_2$, $Si_xN_y$, or another dielectric. In various implementations, RF terminal dielectric segment 216 is a low-k dielectric, such as fluorinated silicon dioxide, carbon-doped silicon oxide, or spin-on organic polymer. RF terminal dielectric segment 216 can be provided, for example, by plasma enhanced CVD (PECVD), high density plasma CVD (HDP-CVD), or spin-on processes.

Lower metal portions 220 of RF terminals 218 extend partially through RF terminal dielectric segment 216. Notably, lower metal portions 220 do not connect to passive segments 214 of PCM 210. That is, lower metal portions 220 are ohmically separated from passive segments 214 of PCM 210. In one implementation, a metal layer is deposited in and over RF terminal dielectric segment 216, and then planarized with RF terminal dielectric segment 216, for example, using chemical machine polishing (CMP), thereby forming lower metal portions 220. In an alternative implementation, a damascene process is used to form lower metal portions 220. In various implementations, lower metal portions 220 can comprise tungsten (W), aluminum (Al), or copper (Cu). Lower metal portions 220 are part of RF terminals 218 that provide RF signals to and from PCM 210. As described below, lower metal portions 220 are capacitively coupled to passive segments 214 of PCM 210. In an alternative implementation, only one lower metal portion 220 is capacitively coupled to its respective passive segment 214 of PCM 210, while the other lower metal portion 220 is directly and ohmically connected to its respective passive segment 214. As such, only one RF terminal is ohmically separated from and capacitively coupled to a respective passive segment of the PCM, while the other RF terminal is ohmically connected to its respective passive segment of the PCM.

Upper metal portions 222 are situated over RF terminal dielectric segment 216 and over lower metal portions 220. Notably, in the present implementation, upper metal portions 222 are ohmically connected to lower metal portions 220. Together, lower metal portions 220 and upper metal portions 222 make up RF terminals 218 that provide RF signals to and from PCM 210. Upper metal portions 222 are made from an interconnect metal of generally any multi-layer stack of interconnect metals and interlayer dielectrics suitable for semiconductor devices. Upper metal portions 222 facilitate external connections for RF switch 200 and also improve signal handling. In the present implementation, upper metal portions 222 are a first interconnect metal (i.e., M1). In other implementations, upper metal portions 222 may be any other interconnect metal of a multi-level metallization. In one implementation, a first interconnect metal is deposited over RF terminal dielectric segment 216 and over lower metal portions 220, and then a middle segment thereof overlying active segment 212 is patterned, thereby forming upper metal portions 222. In an alternative implementation, a damascene process is used to form upper metal portions 222. In various implementations, upper metal portions 222 can comprise W, Al, or Cu. In one implementation, lower metal portions 220 can comprise W. and upper metal portions 222 can comprise Al or Cu. Although lower metal portions 220 and upper metal portions 222 are aligned in FIG. 2, in various implementations, upper metal portions 222 can have an offset towards active segment 212 of PCM 210 or can have an offset away from active segment 212 of PCM 210.

Upper dielectric 224 is situated on top of upper metal portions 222 and RF terminal dielectric segment 216. Upper dielectric 224 is an interlayer dielectric of generally any multi-layer stack of interconnect metals and interlayer dielectrics suitable for semiconductor devices. Upper dielectric 224 provides insulation for upper metal portions 222. In the present implementation, upper dielectric 224 is the top interlayer dielectric. In various implementations, RF switch 200 can include more interconnect metal levels and/or more interlayer dielectrics than shown in FIG. 2. In various implementations, upper dielectric 224 can comprise $SiO_2$, silicon nitride, or another dielectric.

Because passive segments 214 of PCM 210 maintain a conductive crystalline state, capacitors 230 are formed by passive segments 214 of PCM 210, RF terminal dielectric segment 216, and lower metal portions 220 of RF terminals 218. Capacitors 230 capacitively couple lower metal portions 220 to passive segments 214, creating part of an RF signal path of RF switch 200, despite that lower metal portions 220 and passive segments 214 are ohmically separated from each other. Capacitors 230 in FIG. 2 generally correspond to PCM contact capacitors 130 in FIGS. 1A and 1B.

When RF switch 200 is in an OFF state, active segment 212 of PCM 210 maintains resistive amorphous state, while passive segments 214 of PCM 210 maintain a conductive crystalline state. Thus, capacitor 284 is formed by amorphized active segment 212 of PCM 210 and passive segments 214 of PCM 210. Capacitor 284 in FIG. 2 generally corresponds to PCM capacitor 184 in FIGS. 1A and 1B.

As described above, capacitor 284 has a relatively small capacitance value, while capacitors 230 have relatively large capacitance values. In one implementation, the capacitance value of capacitor 284 can measure on the scale of femto-Farads (fF), while one of capacitors 230 can measure on the scale of pico-Farads (pF). The equivalent capacitance of RF switch 200 in the OFF state can be approximated by Equation (3) above. RF switch 200 in the OFF state represents capacitor 284. In the OFF state, RF switch 200 can use capacitor 284 for fine tuning the capacitive load of a capacitive tuning circuit, such as capacitive tuning circuit 190 in FIGS. 1A and 1B. The equivalent capacitance of RF switch 200 in the ON state can be approximated by Equation (5) above. RF switch 200 in the ON state represents capacitors 230. In the ON state, RF switch 200 can use capacitors 230 for coarse tuning the capacitive load of a capacitive tuning circuit, such as capacitive tuning circuit 190 in FIGS. 1A and 1B.

Figure 3:
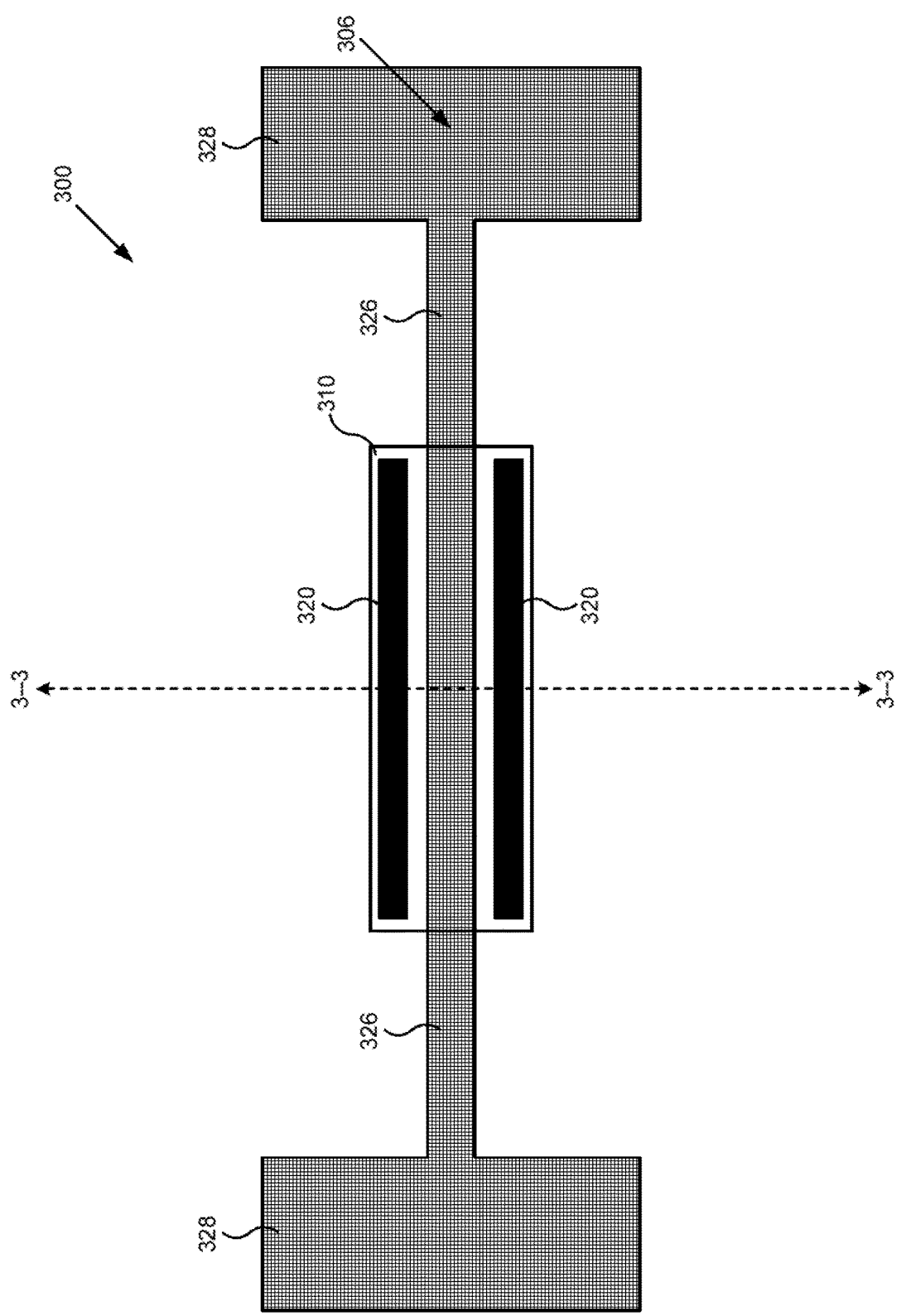
FIG. 3 illustrates a top view of a portion of a PCM RF switch according to one implementation of the present application.

FIG. 3 illustrates a top view of a portion of a PCM RF switch according to one implementation of the present application. FIG. 2 illustrates a cross-sectional view along line "3-3" in FIG. 3. RF switch 300 includes heating element 306 having heater line 326 and heater contacts 328, PCM 310, and lower metal portions 320 of RF terminals. For purposes of illustration, the top view in FIG. 3 shows selected structures. RF switch 300 may include other structures not shown in FIG. 3.

Heating element 306 extends along RF switch 300 transverse to PCM 310, and includes heater line 326 and heater contacts 328. Heater line 326 is approximately centered along heating element 306. Heater line 326 underlies PCM 310, and is seen through PCM 310. Heater contacts 328 are situated at the two ends of heating element 306. In the present implementation, heater contacts 328 occupy a relatively a large area. In other implementations, heater contacts 328 may have any other size or shape. Heater contacts 328 provide for connection of, for example, a voltage or current pulse generator (not shown in FIG. 3) to heater line 326. Heater line 326 provides Joule heating for converting current pulses into heat pulses. In FIG. 3, heating element 306 generates a crystallizing or an amorphizing heat pulse for transforming an active segment of PCM 310, as described above. Heating element 306 in FIG. 3 generally corresponds to heating element 206 in FIG. 2 and may have any implementations and advantages described above.

PCM 310 in FIG. 3 generally corresponds to PCM 210 in FIG. 2 and may have any implementations and advantages described above. In response to a crystallizing or an amorphizing heat pulse generated by heating element 306, an active segment of PCM 310 can transform from a crystalline phase that easily conducts electrical current to an amorphous phase that does not easily conduct electrical current and, thus, can transform the state of RF switch 300 to an ON state or an OFF state, as described above.

Lower metal portions 320 of RF terminals are coupled to passive segments of PCM 310. According to the implementation of FIG. 2, lower metal portions 320 of RF terminals would be capacitively coupled to passive segments of PCM 310. In other implementations, lower metal portions 320 of RF terminals can be ohmically connected to passive segments of PCM 310, as described below. Lower metal portions 320 of RF terminals provide RF signals to and from PCM 310. In various implementations, lower metal portions 320 of RF terminals can comprise W, Al, or Cu.

Figure 4:
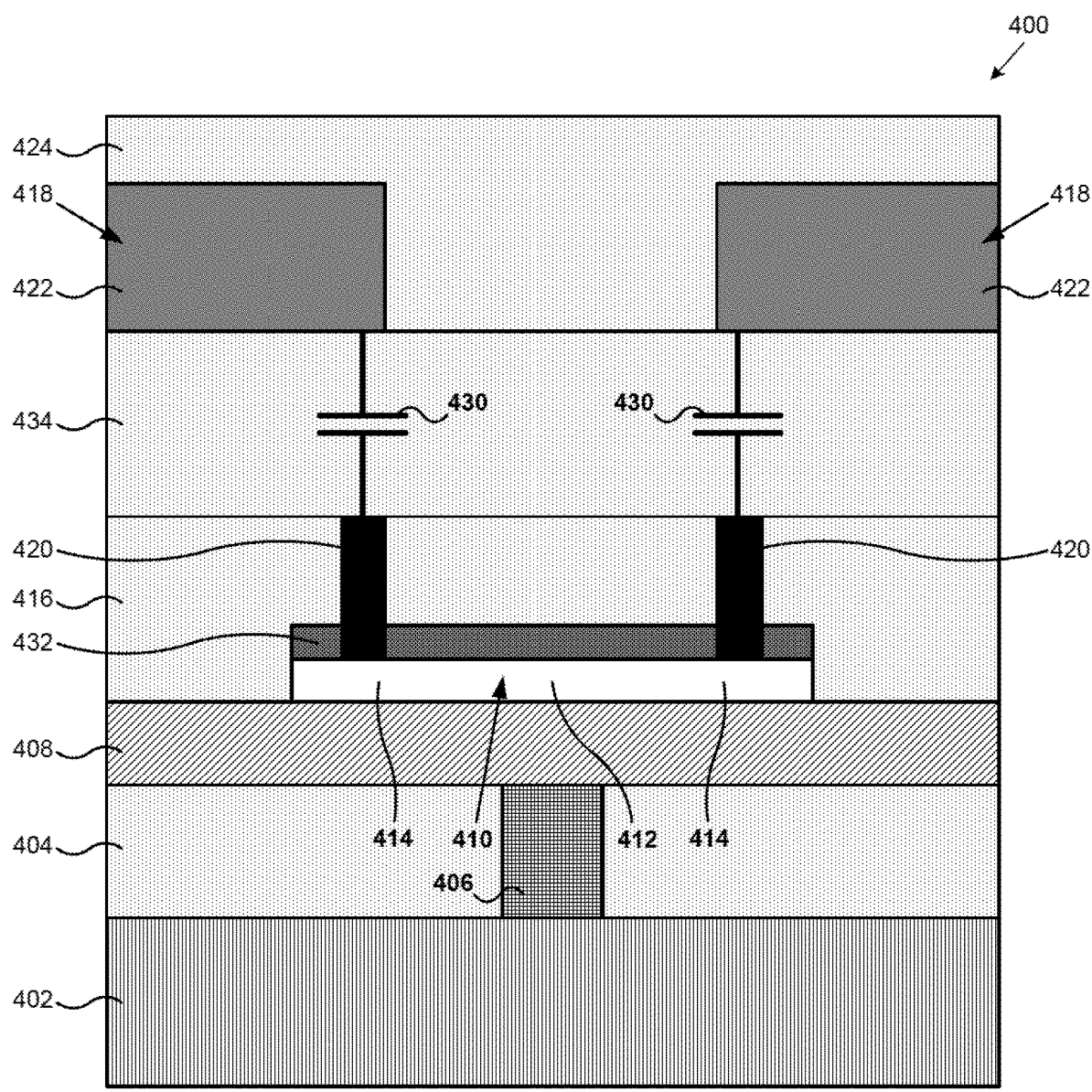
FIG. 4 illustrates a cross-sectional view of a portion of a PCM RF switch according to one implementation of the present application.

FIG. 4 illustrates a cross-sectional view of a portion of a PCM RF switch according to one implementation of the present application. FIG. 4 can represent a cross-sectional view along line "3-3" in FIG. 3. RF switch 400 includes substrate 402, lower dielectric 404, heating element 406, thermally conductive and electrically insulating layer 408, PCM 410 having active segment 412 and passive segments 414, optional contact uniformity support layer 432, RF terminal dielectric segment 416. RF terminals 418 having lower metal portions 420 and upper metal portions 422, pre-metal dielectric 434, upper dielectric 424, and metal-oxide-metal (MOM) capacitors 430.

Substrate 402, lower dielectric 404, heating element 406, thermally conductive and electrically insulating layer 408, PCM 410 having active segment 412 and passive segments 414, RF terminal dielectric segment 416, and upper dielectric 424 in RF switch 400 in FIG. 4 are similar to corresponding structures in RF switch 200 in FIG. 2, and may have any implementations and advantages described above.

In the implementation of FIG. 4, RF switch 400 is illustrated in the ON state. Active segment 412 is unshaded to represent a crystalline segment of PCM 410 transformed in response to a crystallizing heat pulse generated by heating element 406. A PCM capacitor, such as PCM capacitor 284 in FIG. 2, is not formed when active segment 412 of PCM 410 is crystalline and RF switch 400 is in an ON state.

In RF switch 400, optional contact uniformity support layer 432 is situated over PCM 410. In one implementation, optional contact uniformity support layer 432 comprises $Si_xN_y$. In another implementation, optional contact uniformity support layer 432 is a bi-layer that comprises oxide and nitride, such as $SiO_2$ under $Si_xN_y$. Optional contact uniformity support layer 432 can be provided, for example, by PECVD or HDP-CVD. RF terminal dielectric segment 416 is situated over optional contact uniformity support layer 432. Otherwise, RF terminal dielectric segment 416 in FIG. 4 generally corresponds to RF terminal dielectric segment 216 in FIG. 2.

Lower metal portions 420 of RF terminals 418 extend through RF terminal dielectric segment 416 and through optional contact uniformity support layer 432 (in case optional contact uniformity support layer 432 is used). In contrast to lower metal portions 220 in FIG. 2, lower metal portions 420 in FIG. 4 are ohmically connected to passive segments 414 of PCM 410. In the present implementation, forming lower metal portions 420 of RF terminals 418 may comprise two different etching actions. In the first etching action, RF terminal dielectric segment 416 can be aggressively etched without having to accurately time the etching action. This etching action can use a selective etch, for example, a fluorine-based plasma dry etch, and optional contact uniformity support layer 432 can perform as an etch stop while RF terminal dielectric segment 416 is selectively etched.

In the second etching action, optional contact uniformity support layer 432 is punch-through etched. As used herein, "punch-through" refers to a short etching action that can be accurately timed to stop at the top surface of PCM 410. In RF switch 400, lower metal portions 420 are narrow and optional contact uniformity support layer 432 is thin. Thus, only a small volume of optional contact uniformity support layer 432 is etched, and the punch-through etching action is short and can be accurately timed. In one implementation, a chlorine-based plasma dry etch is used for this etching action. Optional contact uniformity support layer 432 is optional in that the inventive concepts of the present application may be implemented without optional contact uniformity support layer 432, and lower metal portions 420 can extend through RF terminal dielectric segment 416 into PCM 410. Because the ON state resistance ($R_{ON}$) of RF switch 400 depends heavily on the uniformity of contact made between lower metal portions 420 and PCM 410, the $R_{ON}$ is significantly lower when optional contact uniformity support layer 432 is used.

Pre-metal dielectric 434 is situated over RF terminal dielectric segment 416 and over lower metal portions 420. Pre-metal dielectric 434 aids formation of upper metal portions 422 of RF terminals 418 and processing of interconnect metals in a multi-level metallization. In various implementations, pre-metal dielectric 434 can comprise borophosphosilicate glass (BPSG), tetra-ethyl ortho-silicate (TEOS), silicon onynitride ($SiO_xN_y$), $SiO_2$. $Si_xN_y$, or another dielectric.

Upper metal portions 422 of RF terminals 418 are situated over pre-metal dielectric 434 and in upper dielectric 424. In the present implementation, upper metal portions 422 are a first interconnect metal (i.e., M1). In other implementations, upper metal portions 422 may be any other interconnect metal of a multi-level metallization. Notably, upper metal portions 422 do not physically connect to lower metal portions 420. That is, upper metal portions 422 are ohmically separated from lower metal portions 420. Otherwise, upper metal portions 422 in FIG. 4 generally correspond to upper metal portions 222 in FIG. 2.

MOM capacitors 430 are formed by lower metal portions 420 of RF terminals 418, pre-metal dielectric 434, and upper metal portions 422 of RF terminals 418. MOM capacitors 430 capacitively couple upper metal portions 422 to lower metal portions 420, creating part of an RF signal path of RF switch 400, despite the fact that upper metal portions 422 and lower metal portions 420 are ohmically separated from each other.

MOM capacitors 430 in FIG. 4 are formed farther away from PCM 410 along the RF signal path, relative to capacitors 230 in FIG. 2. In an alternative implementation, only one MOM capacitor 430 is formed by a respective lower metal portion 420 of a respective RF terminal 418, pre-metal dielectric 434, and upper metal portion 422. In this alternative implementation, the other lower metal portion 420 is directly and ohmically connected to its respective upper metal portion 422. The direct connection can be formed using standard CMOS via damascene processes. As such, only one RF terminal 418 is capacitively coupled to a respective passive segment 414 of PCM 410, while the other RF terminal 418 is ohmically connected to its respective passive segment 414 of PCM 410.

Figure 5:
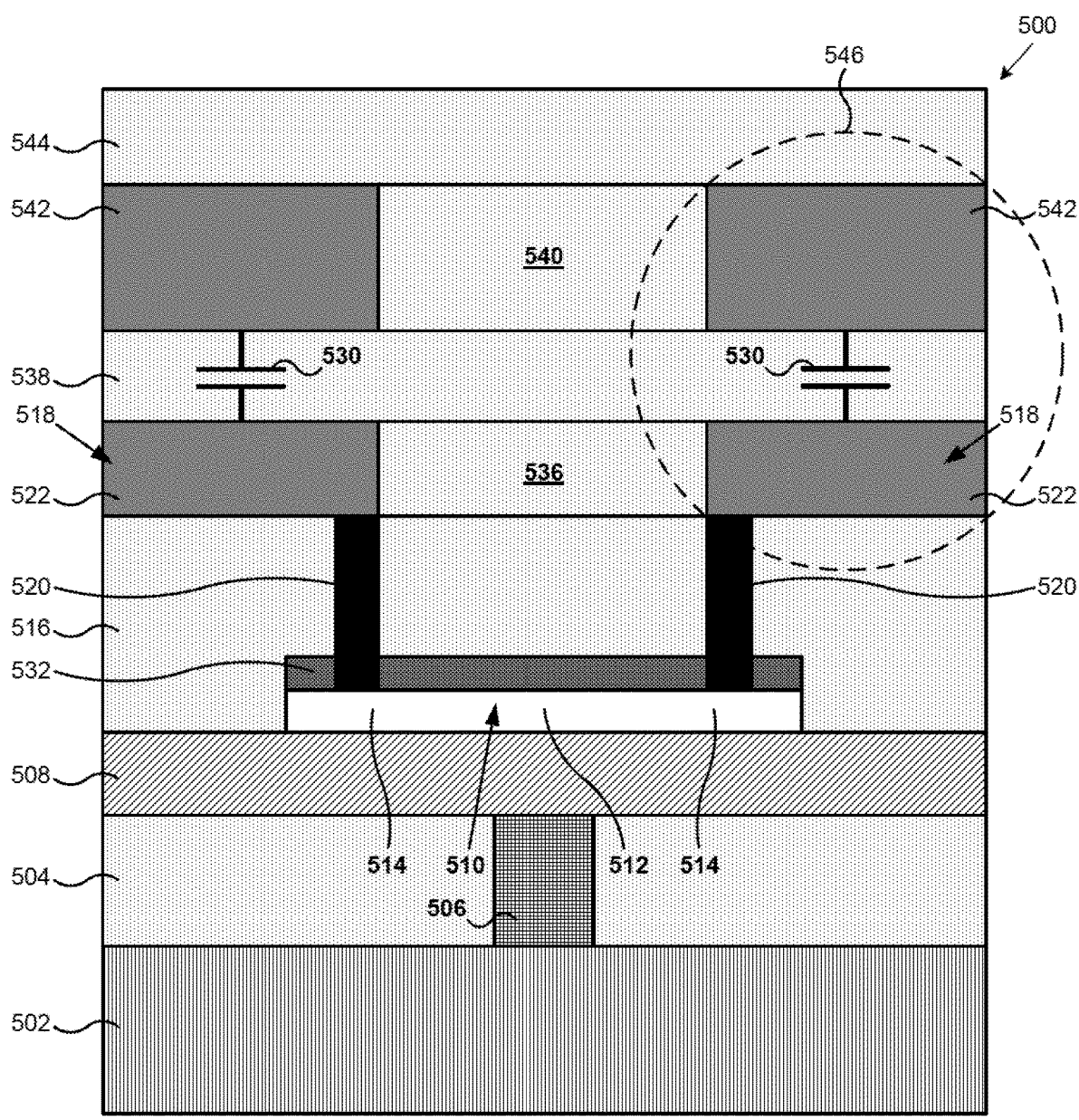
FIG. 5 illustrates a cross-sectional view of a portion of a PCM RF switch according to one implementation of the present application.

FIG. 5 illustrates a cross-sectional view of a portion of a PCM RF switch according to one implementation of the present application. FIG. 5 can represent a cross-sectional view along line "3-3" in FIG. 3. RF switch 500 includes substrate 502, lower dielectric 504, heating element 506, thermally conductive and electrically insulating layer 508, PCM 510 having active segment 512 and passive segments 514, optional contact uniformity support layer 532, RF terminal dielectric segment 516, RF terminals 518 having lower metal portions 520 and upper metal portions 522, interlayer metal levels 536 and 540, interlayer dielectrics 538 and 544, interconnect metals 542, and MOM capacitors 530. Substrate 502, lower dielectric 504, heating element 506, thermally conductive and electrically insulating layer 508, PCM 510 having active segment 512 and passive segments 454, optional contact uniformity support layer 532, and RF terminal dielectric segment 516 in RF switch 500 in FIG. 5 are similar to corresponding structures in RF switch 400 in FIG. 4, and may have any implementations and advantages described above.

In RF switch 500, interlayer metal level 536, interlayer dielectric 538, interlayer metal level 540, and interlayer dielectric 544 are sequentially situated over RF terminal dielectric segment 516. Interlayer metal levels 536 and 540 provide layers in which interconnect metals can be built. Interlayer dielectrics 538 and 544 provide insulation between interlayer metal levels 536 and 540. In the present implementation, interlayer metal level 540 is the top interlayer metal level. In various implementations, RF switch 500 can include more interlayer metal levels and/or more interlayer dielectrics than shown in FIG. 5.

Upper metal portions 522 are situated in interlayer metal level 536 over RF terminal dielectric segment 516 and over lower metal portions 520. In the present implementation, upper metal portions 522 are a first interconnect metal (i.e., M1). In other implementations, upper metal portions 522 may be any other interconnect metal of a multi-level metallization. Notably, upper metal portions 522 are ohmically connected to lower metal portions 520.

Interconnect metals 542 are situated in interlayer metal level 540 over interlayer dielectric 538. In the present implementation, interconnect metals 542 are a second interconnect metal (i.e., M2). In other implementations, interconnect metals 542 may be any other interconnect metal of a multi-level metallization. Notably, interconnect metals 542 are ohmically separated from upper metal portions 522.

MOM capacitors 530 are formed by upper metal portions 522 of RF terminals 518, interlayer dielectric 538, and interconnect metals 542. MOM capacitors 530 capacitively couple interconnect metals 542 to upper metal portions 522, creating part of an RF signal path of RF switch 500, despite the fact that interconnect metals 542 and upper metal portions 522 are ohmically separated from each other. As described above, lower metal portions 520 are narrow in order to punch-through etch optional contact uniformity layer 532. Narrower lower metal portions 520 also decrease parasitic capacitive coupling to heating element 506. In FIG. 4, because lower metal portions 420 are narrow, small misalignment of lower metal portions 420 or upper metal portions 422 can impact the value of MOM capacitors 430. In FIG. 5, MOM capacitors 530 are formed farther away from heating element 506, decreasing parasitic capacitive coupling to heating element 506, and allowing for wider upper metal portions 522 and wider interconnect metals 542. When upper metal portions 522 and interconnect metals 542 are wider, misalignment of upper metal portions 522 and interconnect metals 542 has less impact on the value of MOM capacitors 530. Thus, RF switch 500 affords some tolerance for misalignment. Additionally, because MOM capacitors 530 are formed by upper metal portions 522 and interconnect metals 542 and interlayer dielectric 538, MOM capacitors 530 are easily integrated in multi-level metallization. In an alternative implementation, only one MOM capacitor 530 is formed by a respective upper metal portion 522 of a respective RF terminal 518, interlayer dielectric 538, and interconnect metal 542. In this alternative implementation, the other upper metal portion 522 is directly and ohmically connected to its respective interconnect metal 542. The direct connection can be formed using standard CMOS via damascene processes. As such, only one interconnect metal 542 is capacitively coupled to a respective passive segment 514 of PCM 510, while the other interconnect metal 542 is ohmically connected to its respective passive segment 514 of PCM 510.

Figure 6A:
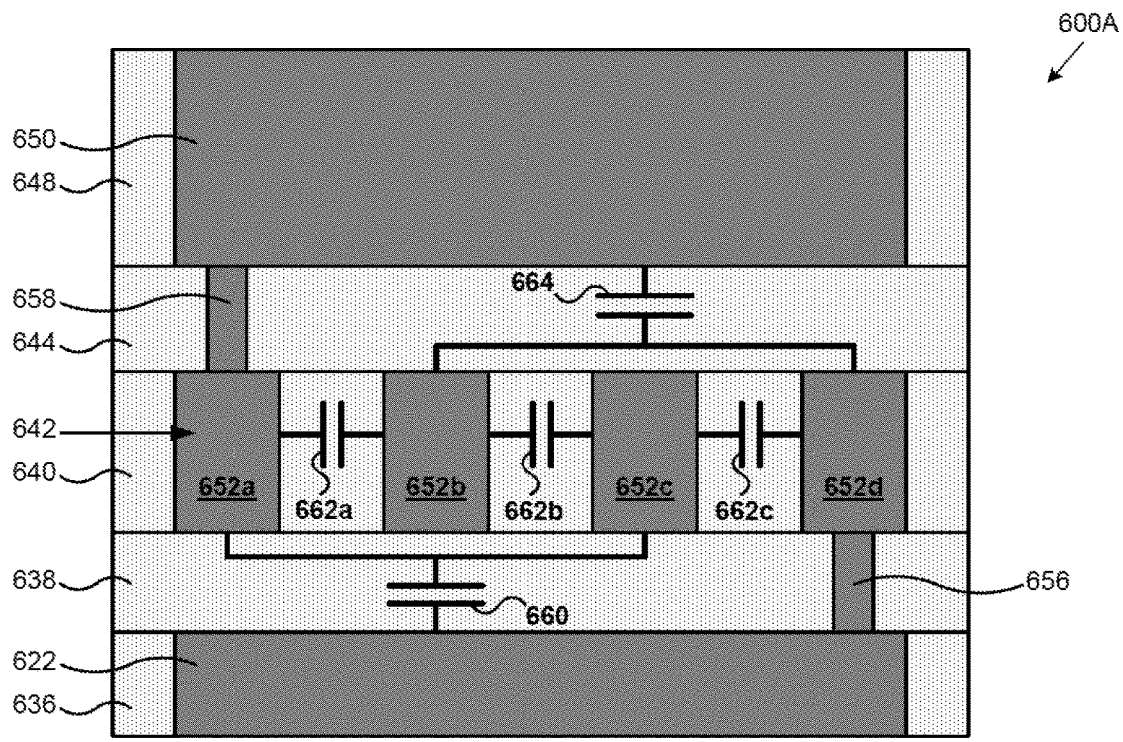
FIG. 6A illustrates a cross-sectional view of a portion of a metal-oxide-metal (MOM) capacitor structure for use in one implementation of the present application.

FIG. 6A illustrates a cross-sectional view of a portion of a MOM capacitor structure according to one implementation of the present application. FIG. 6A represents a MOM capacitor structure that can be used instead of the structure shown in outline 546 in FIG. 5. MOM capacitor structure 600A includes interlayer metal levels 636, 640, and 648, interlayer dielectrics 638 and 644, interconnect metals 622, 642, and 650, fingers 652a, 652b, 652c, and 652d, vias 656 and 658, and capacitors 660, 662a, 662b, 662c, and 664.

In FIG. 6A, interconnect metal 622 is a first interconnect metal situated in interlayer metal level 636. Interlayer dielectric 638 is situated above interconnect metal 622 and interlayer metal level 636. Interconnect metal 642 is a second interconnect metal situated in interlayer metal level 640 above interlayer dielectric 638. Interconnect metal 642 has fingers 652a, 652b, 652c, and 652d. In other implementations, interconnect metal 642 can have more or fewer fingers than shown in FIG. 6A. In the cross sectional view of FIG. 6A, fingers 652a, 652b, 652c, and 652d are substantially rectangular and approximately equally spaced from one another in interlayer metal level 640. In various implementations, fingers 652a, 652b, 652c, and 652d can have different shapes and/or spacing than shown in FIG. 6A. Interlayer dielectric 644 is situated above interconnect metal 642 and interlayer metal level 640. Interconnect metal 650 is a third interconnect metal situated in interlayer metal level 648 above interlayer dielectric 644.

Via 656 extends through interlayer dielectric 638, connecting interconnect metal 622 to interconnect metal 642 (and more specifically to finger 652d). As described below, fingers 652b and 652d are connected to each other. Thus, interconnect metal 622, via 656, and fingers 652b and 652d together form one node. Likewise, via 658 extends through interlayer dielectric 644, connecting interconnect metal 642 (and more specifically finger 652a) to interconnect metal 650. As described below, fingers 652a and 652c are connected to each other. Thus, interconnect metal 650, via 658, and fingers 652a and 652c together form another node.

Capacitor 660 is formed by interconnect metal 622, interlayer dielectric 638, and interconnect metal 642. Capacitor 660 represents a combination of capacitors formed between interconnect metal 622 and finger 652a, and between interconnect metal 622 and finger 652c. Capacitors 662a, 662b, and 662c are formed between adjacent fingers of interconnect metal 642. Specifically, capacitor 662a is formed between fingers 652a and 652b, capacitor 662b is formed between fingers 652b and 652c, and capacitor 662c is formed between fingers 652c and 652d. Capacitor 664 is formed by interconnect metal 642, interlayer dielectric 644, and interconnect metal 650. Capacitor 664 represents a combination of capacitors formed between interconnect metal 650 and finger 652b, and between interconnect metal 650 and finger 652d. MOM capacitor structure 600A utilizes areas below, between, and above interconnect metal 642 to form capacitors 660, 662a, 662b, 662c, and 664 between two nodes. When these nodes are used in the RF signal path for an RF switch, such as in outline 546 in FIG. 5. MOM capacitor structure 600A increases the capacitance value of capacitors integrated in the RF terminals of the RF switch.

Figure 6B:
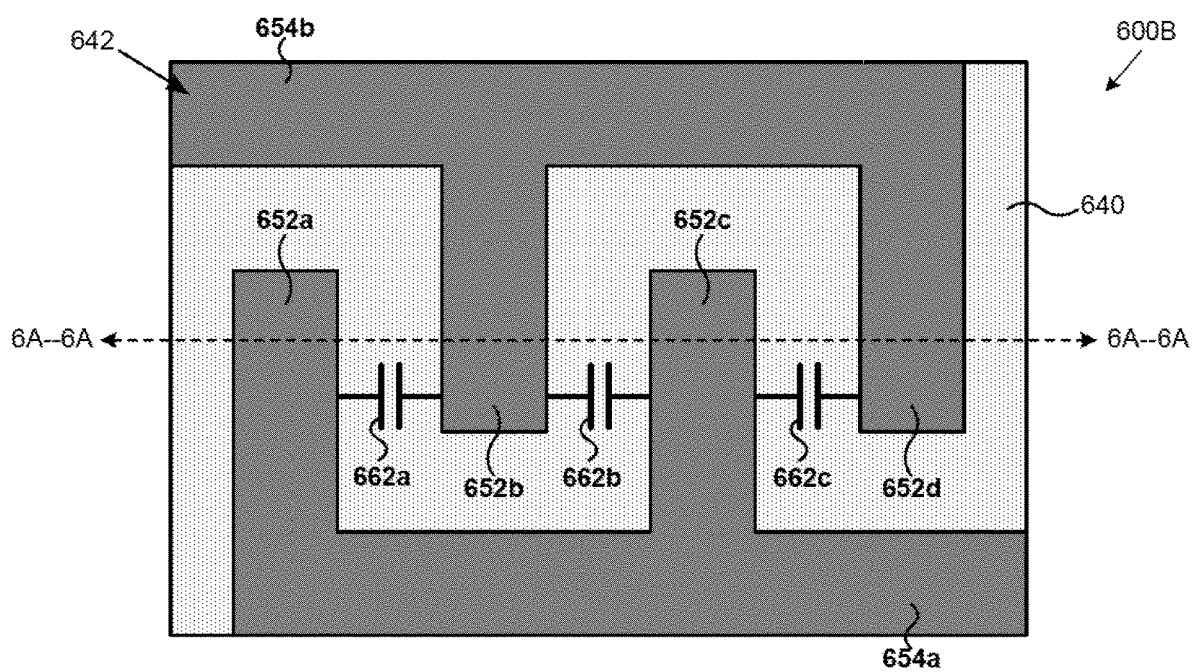
FIG. 6B illustrates a top view of a portion of a MOM capacitor structure corresponding to the MOM capacitor structure of FIG. 6A.

FIG. 6B illustrates a top view of a portion of a MOM capacitor structure corresponding to the MOM capacitor structure of FIG. 6A according to one implementation of the present application. FIG. 6A illustrates a cross-sectional view along line "6A-6A" in FIG. 6B. MOM capacitor structure 600B includes interlayer metal level 640, interconnect metal 642 having fingers 652a, 652b, 652c, and 652d and runners 654a and 654b and capacitors 662a, 662b, and 662c. Interlayer metal level 640, interconnect metal 642 having fingers 652a, 652b, 652c, and 652d, and capacitors 662a, 662b, and 662c in FIG. 6B correspond to similarly labeled structures in FIG. 6A.

In MOM capacitor structure 600B, fingers 652b and 652d are connected to each other by runner 654b. Thus, runner 654b and fingers 652b and 652d are parts of the same node. Likewise, fingers 652a and 652c are connected to each other by runner 654a. Thus, runner 654a and fingers 652a and 652c are parts of another node. In various implementations runners 654a and 654b may connect additional fingers. Finger 652b finger 652d, and/or runner 654b may connect to a lower interconnect metal through a via, such as via 656 in FIG. 6A. Likewise, finger 652a, finger 652c, and/or runner 654a may connect to a higher interconnect metal through a via, such as via 658 in FIG. 6A.

As shown in FIG. 6B, the fingers of interconnect metal 642 are interdigitated. Capacitors 662a, 662b, and 662c are formed between adjacent fingers of interconnect metal 642. More specifically, capacitor 662a is formed between fingers 652a and 652b, capacitor 662b is formed between fingers 652b and 652c, and capacitor 662c is formed between fingers 652c and 652d. Although not explicitly labeled in FIG. 6B, it is noted that capacitors are also formed between runner 654a and finger 652b, between runner 654a and finger 652d, between runner 654b and finger 652a, and between runner 654b and finger 652c. When the nodes of interconnect metal 642 are used in the RF signal path for an RF switch, such as in outline 546 in FIG. 5, MOM capacitor structure 600B increases the capacitance value of capacitors integrated in the RF terminals of the RF switch.

Figure 7:
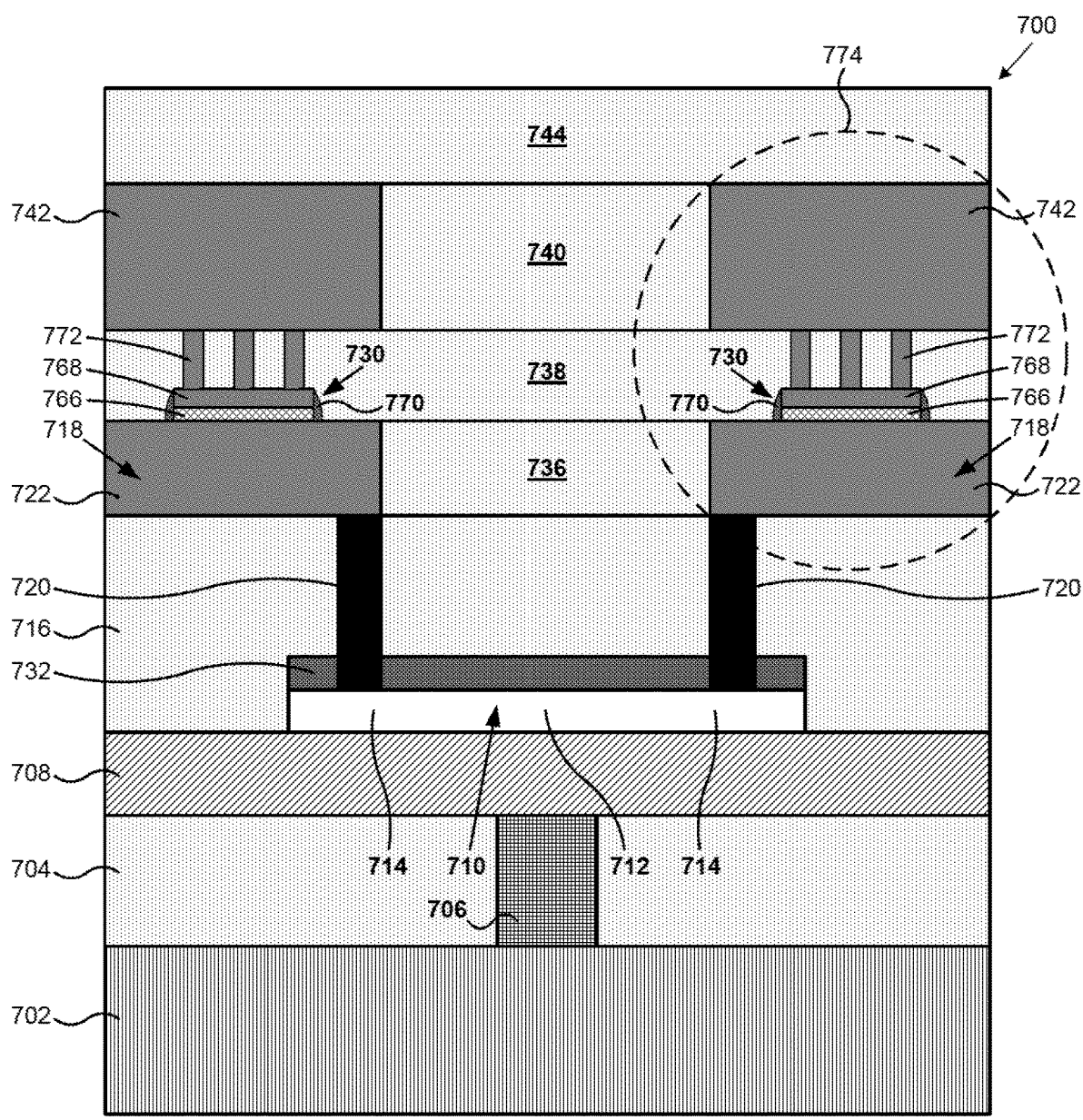
FIG. 7 illustrates a cross-sectional view of a portion of a PCM RF switch according to one implementation of the present application.

FIG. 7 illustrates a cross-sectional view of a portion of a PCM RF switch according to one implementation of the present application. FIG. 7 can represent a cross-sectional view along line "3-3" in FIG. 3. RF switch 700 includes substrate 702, lower dielectric 704, heating element 706, thermally conductive and electrically insulating layer 708, PCM 710 having active segment 712 and passive segments 714, optional contact uniformity support layer 732, RF terminal dielectric segment 716, RF terminals 718 having lower metal portions 720 and upper metal portions 722, interlayer metal levels 736 and 740, interlayer dielectrics 738 and 744, interconnect metals 742, metal-insulator-metal (MIM) capacitors 730 having insulating films 766 and top MIM metals 768, spacers 770, and vias 772. Substrate 702, lower dielectric 704, heating element 706, thermally conductive and electrically insulating layer 708, PCM 710 having active segment 712 and passive segments 714, optional contact uniformity support layer 732, RF terminal dielectric segment 716, RF terminals 718 having lower metal portions 720 and upper metal portions 722, interlayer metal levels 736 and 740, interlayer dielectrics 738 and 744, and interconnect metals 742 in RF switch 700 in FIG. 7 are similar to corresponding structures in RF switch 500 in FIG. 5, and may have any implementations and advantages described above.

In RF switch 700, insulating films 766 are situated on upper metal portions 722. In various implementations, insulating films 766 are high-k dielectrics, such as tantalum pentoxide, aluminum oxide, hafnium oxide, zirconium oxide, zirconium aluminum silicate, hafnium silicate, hafnium aluminum silicate or other dielectrics with a relatively high dielectric constant. In one implementation, the thickness of insulating films 766 can range from approximately two hundred angstroms to approximately six hundred angstroms (200 Å-600 Å).

Top MIM metals 768 are situated over insulating films 766. Top MIM metals 768 can comprise, for example, titanium nitride, tantalumn nitride, or a stack comprising aluminum and titanium nitride or tantalumn nitride. In one implementation, the thickness of top MIM metals 768 can range from approximately one thousand angstroms to approximately three thousand angstroms (1,000 Å-3,000 Å). Top MIM metals 768 can be provided, for example, by PVD or CVD techniques. It is noted that, unlike interconnect metals 742, top MIM metals 768 are not formed in interlayer metal levels, such as interlayer metal levels 736 and 740. As used herein, "MIM capacitor" refers to a capacitor having a top metal formed within an interlayer dielectric where conventionally no metal exists, such as within interlayer dielectric 738.

Spacers 770 are situated adjacent to the sidewalls of insulating films 766 and top MIM metals 768 of MIM capacitors 730. In various implementations, spacers 770 can comprise $Si_XN_Y$, or another dielectric. Spacers 770 protect the sidewalls of insulating films 766 from aggressive etch chemistry used to etch metals during fabrication of RF switch 700. Thus, there is no increase in leakage current of MIM capacitors 730 or decrease in the breakdown voltage of MIM capacitors 730 due to an increase in defects or voids within insulating films 766. As such the capacitance value of MIM capacitors 730 is more precisely controlled, and RF switch 700 is more reliable.

Vias 772 connect top MIM metals 768 of MIM capacitors 730 to interconnect metals 742. Thus, for each of MIM capacitors 730, top MIM metal 768, vias 772, and interconnect metals 742 together form one node. In various implementations, each of MIM capacitors 730 can be connected by more or fewer vias than shown in FIG. 7. Notably, because top MIM metals 768 are within interlayer dielectric 738, vias 772 only extend partially through interlayer dielectric 738.

MIM capacitors 730 formed by upper metal portions 722, insulating films 766, and top MIM metals 768 have a capacitance with significantly improved density. MIM capacitors 730 do not require addition of interlayer metal levels, such as interlayer metal level 748 in FIG. 7A, and also do not use up lateral die space. MIM capacitors 730 advantageously increase routing capability because MIM capacitors 730 utilize the space amply available between interlayer metal levels 736 and 740. In an alternative implementation, only one MIM capacitor 730 is formed by a respective upper metal portion 722 of a respective RF terminal 718, insulating film 766, and top MIM metal 768 connected to a respective interconnect metal 742. In this alternative implementation, the other interconnect metal 742 is directly and ohmically connected to its respective upper metal portion 722 without using a MIM capacitor. The direct connection can be formed using standard CMOS via damascene processes. As such, only one interconnect metal 742 is capacitively coupled to a respective passive segment 714 of PCM 710, while the other interconnect metal 742 is ohmically connected to its respective passive segment 714 of PCM 710.

Figure 8:
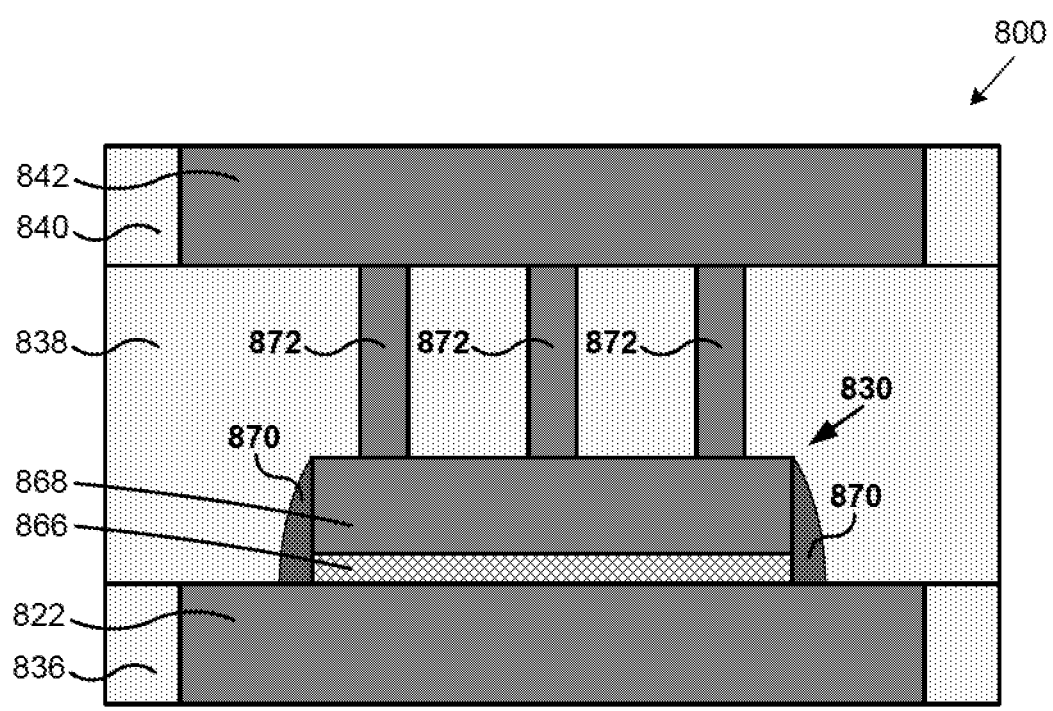
FIG. 8 illustrates a cross-sectional view of a portion of a metal-insulator-metal (MIM) capacitor structure for use in one implementation of the present application.

FIG. 8 illustrates a cross-sectional view of a portion of a metal-insulator-metal (MIM) capacitor structure according to one implementation of the present application. FIG. 8 represents a closer view of the structure shown in outline 774 in FIG. 7. MIM capacitor structure 800 includes upper metal portion 822, interlayer metal levels 836 and 840, interlayer dielectric 838, interconnect metal 842, MIM capacitor 830 having insulating film 866 and top MIM metal 868, spacers 870, and vias 872. Upper metal portions 822, interlayer metal levels 836 and 840, interlayer dielectric 838, interconnect metal 842, MIM capacitor 830 having insulating film 866 and top MIM metal 868, spacers 870, and vias 872 in MIM capacitor structure 800 in FIG. 8 are similar to corresponding structures in RF switch 700 in FIG. 7, and may have any implementations and advantages described above.

Figure 9:
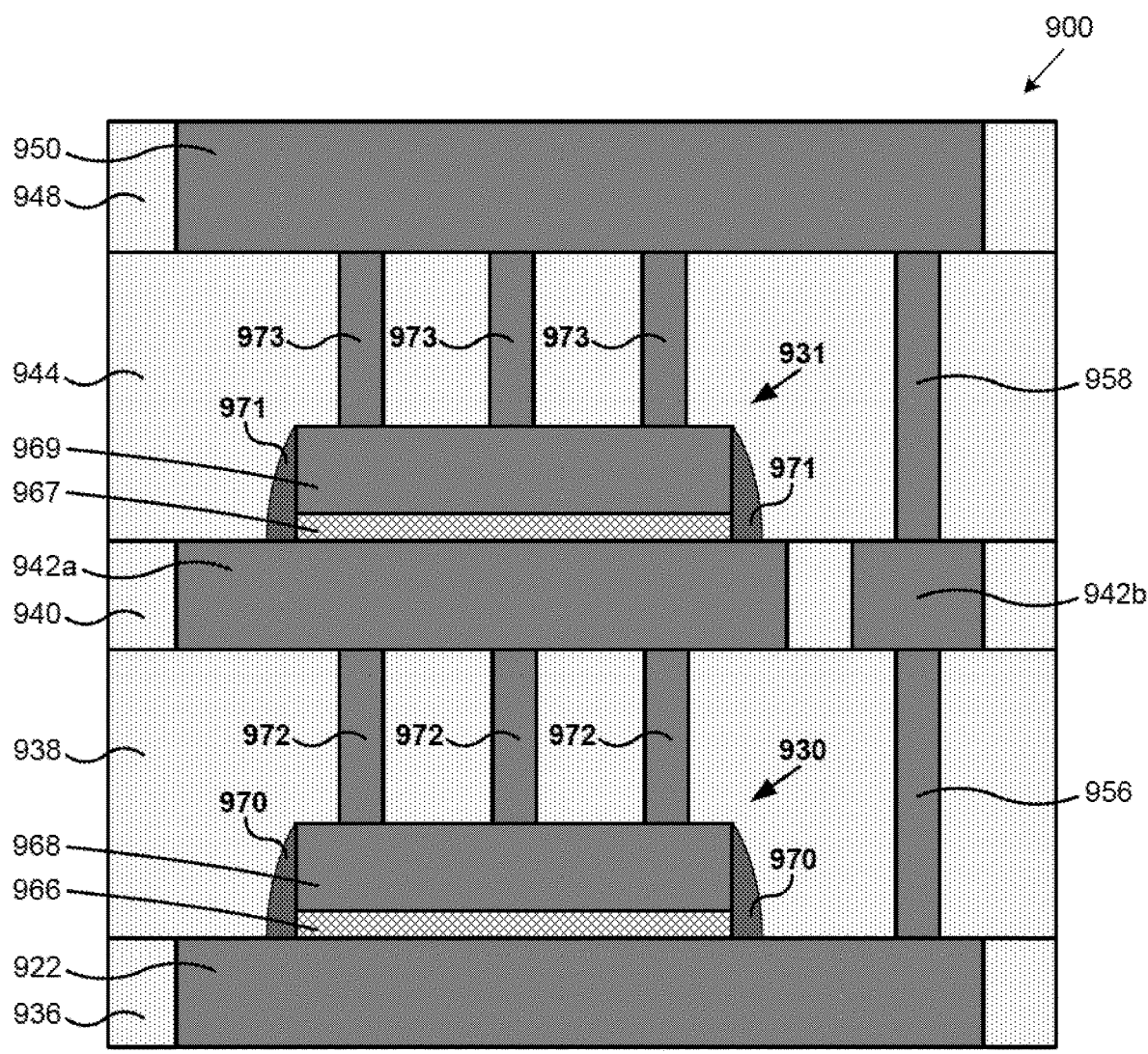
FIG. 9 illustrates a cross-sectional view of a portion of a stacked MIM capacitor structure for use in one implementation of the present application.

FIG. 9 illustrates a cross-sectional view of a portion of a stacked MIM capacitor structure according to one implementation of the present application. FIG. 8 represents a stacked MIM capacitor structure than can be used instead of the structure shown in outline 774 in FIG. 7. Stacked MIM capacitor structure 900 is formed by stacking two distinct MIM capacitors, i.e. MIM capacitor 930 and MIM capacitor 931. Stacked MIM capacitor structure 900 includes upper metal portion 922, interlayer metal levels 936, 940, and 948, interlayer dielectrics 938 and 944, interconnect metals 942a, 942b, and 950. MIM capacitor 930 includes insulating film 966 and top MIM metal 968, spacers 970 and vias 972 and 956. MIM capacitor 931 includes insulating film 967 and top MIM metal 969, spacers 971, and vias 973 and 958. Upper metal portion 922, interlayer metal levels 936, 940, and 948, interlayer dielectrics 938 and 944, interconnect metal 950, and vias 956 and 958 in MIM capacitor structure 900 in FIG. 9 are similar to corresponding structures in MOM capacitor structure 600A in FIG. 6A, and may have any implementations and advantages described above. MIM capacitor 930 having insulating film 966 and top MIM metal 968, spacers 970, vias 972, and interconnect metal 942a in stacked MIM capacitor structure 900 in FIG. 9 are similar to corresponding structures in MIM capacitor structure 800 in FIG. 8, and may have any implementations and advantages described above.

As shown in stacked MIM capacitor structure 900 in FIG. 9, MIM capacitor 931 is stacked over MIM capacitor 930. Insulating film 967 of MIM capacitor 931 is situated on interconnect metal 942a. Top MIM metal 969 of MIM capacitor 931 is situated over insulating film 967 and is in interlayer dielectric 944. Spacers 971 are situated adjacent to the sidewalls of insulating film 967 and top MIM metal 969 of MIM capacitor 931.

Vias 973 extend partially through interlayer dielectric 944 and connect top MIM metal 969 of MIM capacitor 931 to interconnect metal 950. Via 958 extends fully through interlayer dielectric 944 and connects interconnect metal 950 to interconnect metal 942b. Interconnect metal 942b is situated in interlayer metal level 940, and separated from interconnect metal 942a. Via 956 extends fully through interlayer dielectric 938 and connects interconnect metal 942b to upper metal portion 922. Thus, top MIM metal 969 of MIM capacitor 931, vias 973, interconnect metal 950, via 958, interconnect metal 942b, via 956, and upper metal portion 922 together form a first node of stacked MIM capacitor structure 900. Similarly, top MIM metal 968 of MIM capacitor 930, vias 972, and interconnect metal 942a form a second node of stacked MIM capacitor structure 900. When used in the RF signal path for an RF switch, such as in outline 774 in FIG. 7, stacked MIM capacitor structure 900 further increases the capacitance value of capacitors integrated in the RF terminals of the RF switch.

Figure 10:
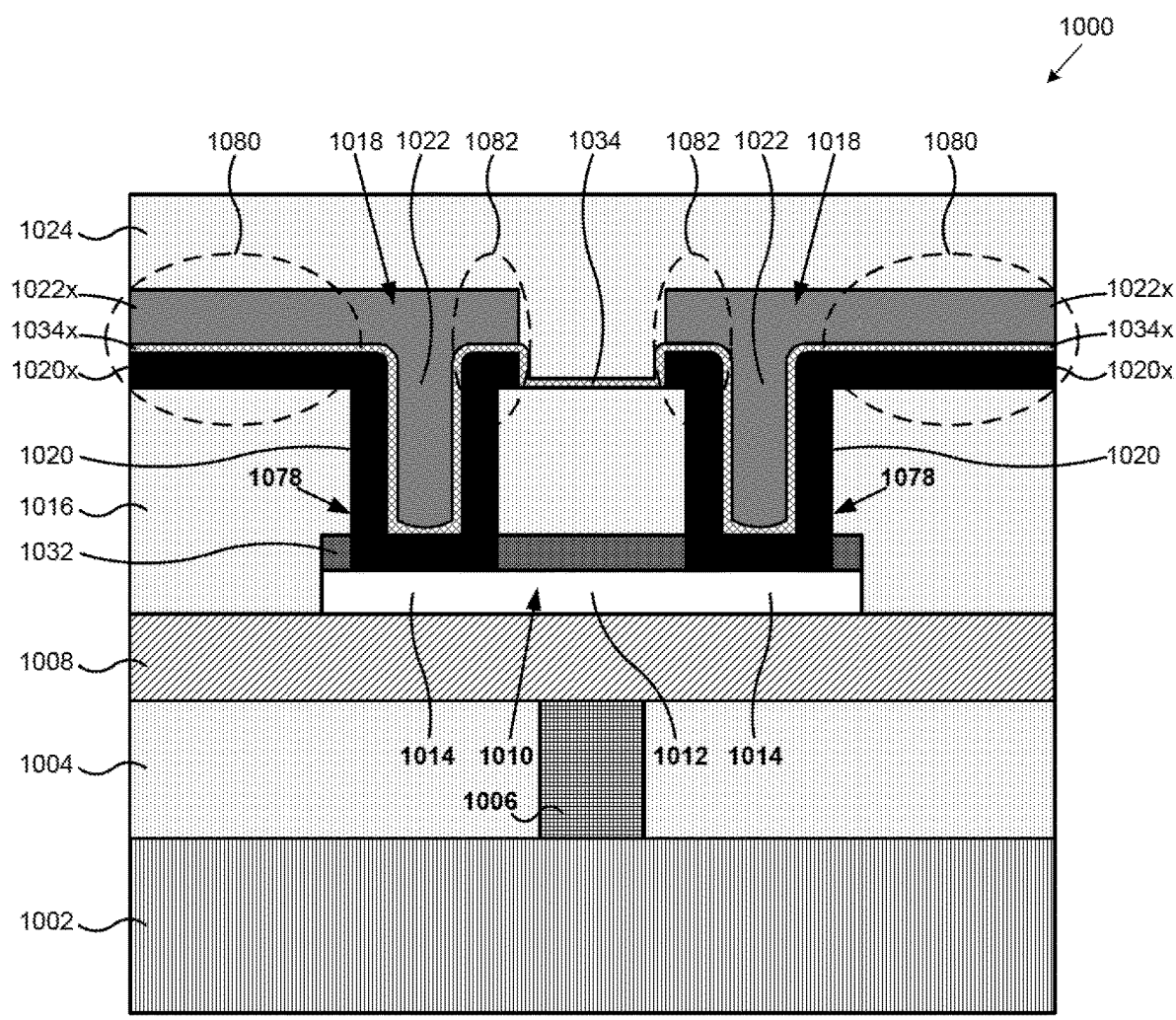
FIG. 10 illustrates a cross-sectional view of a portion of a PCM RF switch according to one implementation of the present application.

FIG. 10 illustrates a cross-sectional view of a portion of a PCM RF switch according to one implementation of the present application. RF switch 1000 includes substrate 1002, lower dielectric 1004, heating element 1006, thermally conductive and electrically insulating layer 1008, PCM 1010 having active segment 1012 and passive segments 1014, optional contact uniformity support layer 1032, RF terminal dielectric segment 1016, trenches 1078, RF terminals 1018 having trench metal liners 1020 and trench metal plugs 1022, dielectric liner 1034, upper dielectric 1024, and overhang regions 1080 and 1082 having trench metal liner extension 1020x, dielectric liner extension 1034x, and trench metal plug extension 1022x. Substrate 1002, lower dielectric 1004, heating element 1006, thermally conductive and electrically insulating layer 1008, PCM 1010 having active segment 1012 and passive segments 1014, optional contact uniformity support layer 1032, RF terminal dielectric segment 1016, and upper dielectric 1024 in RF switch 1000 in FIG. 10 are similar to corresponding structures in RF switch 400 in FIG. 4, and may have any implementations and advantages described above.

In RF switch 1000, trenches 1078 extend through RF terminal dielectric segment 1016 and through optional contact uniformity support layer 1032 (in case optional contact uniformity support layer 1032 is used). Trench metal liners 1020 of RF terminals 1018 line trenches 1078, and are ohmically connected to passive segments 1014 of PCM 1010. In various implementations, trench metal liners 1020 can comprise W, Al, or Cu.

Dielectric liner 1034 is situated in trenches 1078, over trench metal liners 1020. Dielectric liner 1034 lines trench metal liners 1020. In various implementations, dielectric liner 1034 is a high-k dielectric, such as tantalum pentoxide, aluminum oxide, hafnium oxide, zirconium oxide, zirconium aluminum silicate, hafnium silicate, hafnium aluminum silicate or another dielectric with a relatively high dielectric constant. In one implementation, the thickness of dielectric liner 1034 can range from approximately two hundred angstroms to approximately six hundred angstroms (200 Å-600 Å).

Trench metal plugs 1022 are situated in trenches 1078 over dielectric liner 1034. In various implementations, trench metal plugs 1022 can comprise W, Al, or Cu. As described below, trench metal plugs 1022 are ohmically separated from, but capacitively coupled to, trench metal liners 1020.

Outside trenches 1078, trench metal liner extension 1020x, dielectric liner extension 1034x, and trench metal plug extension 1022x are sequentially stacked over RF terminal dielectric segment 1016 in overhang regions 1080 and 1082. Overhang regions 1080 overhang away from active segment 1012 of PCM 1010, while overhang regions 1082 overhang towards active segment 1012 of PCM 1010. Overhang regions 1080 and 1082 are optional in that the inventive concepts of the present application may be implemented without either or both, and trench metal plugs 1022 would still capacitively couple to trench metal liners 1020. However, capacitive coupling between trench metal plugs 1022 and trench metal liners 1020 is strengthened when overhang regions 1080 and 1082 are used.

Although trench metal plugs 1022 are illustrated as integrally formed with trench metal plug extensions 1022x, in one implementation they may be different formations. For example, trench metal plugs 1022 may be situated in trenches 1078 and a first interconnect metal (i.e., M1) may be subsequently formed over trench metal plugs 1022 to form metal plug extensions 1022x. In this example, trench metal plugs 1022 can comprise W, and trench metal plug extensions 1022x can comprise Al or Cu.

Trench metal plugs 1022 are ohmically separated from, but capacitively coupled to, trench metal liners 1020. Because RF switch 1000 utilizes trench metal liners 1020 and trench metal plugs 1022, more interface area is available to capacitively couple, and capacitance values are increased compared to RF switch 400 in FIG. 4. Additionally, because RF switch 1000 utilizes a thin high-k dielectric liner 1034, the capacitive coupling between trench metal liner 1020 and trench metal plug 1022 is significantly increased. Moreover, because RF switch 1000 utilizes overhang regions, capacitive coupling between trench metal liner 1020 and trench metal plug 1022 is further increased. In an alternative implementation, only one trench metal plug 1022 is capacitively coupled to a respective trench metal liner 1020. In this alternative implementation, the other trench metal plug 1022 is directly and ohmically connected to its respective trench metal liner 1020 without using an intervening dielectric liner 1034. As such, only one RF terminal 1018 is capacitively coupled to a respective passive segment 1014 of PCM 1010, while the other RF terminal 1018 is ohmically connected to its respective passive segment 1014 of PCM 1010.

Figure 11:
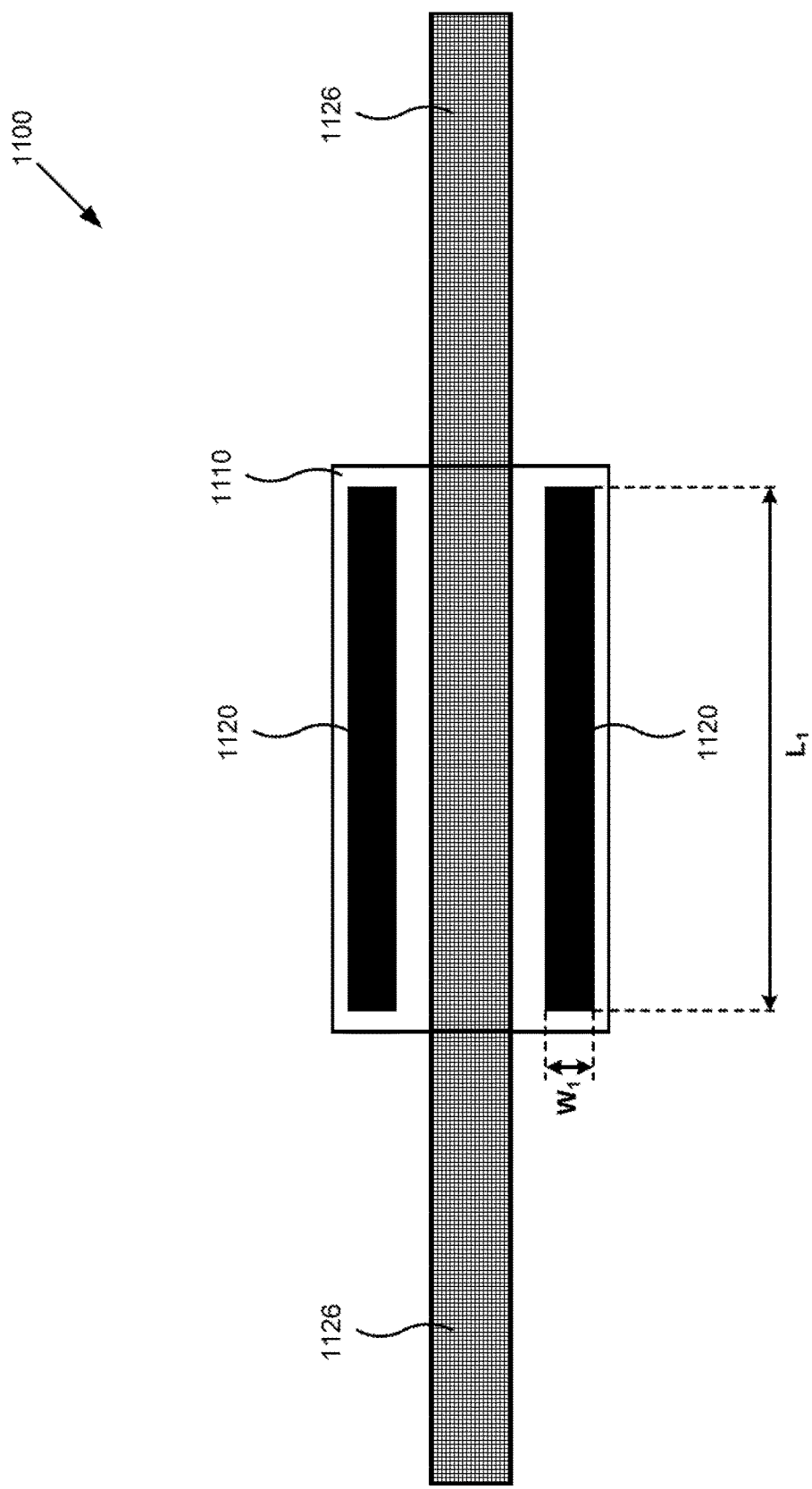
FIG. 11 illustrates a top view of a portion of a lower metal portion of a PCM RF switch according to one implementation of the present application.

FIG. 11 illustrates a top view of a portion of a lower metal portion RF switch according to one implementation of the present application. PCM RF switch 1100 includes heater line 1126, PCM 1110, and lower metal portions 1120 of RF terminals. For purposes of illustration, the top view in FIG. 11 shows selected structures. RF switch 1100 may include other structures not shown in FIG. 11.

Width $W_1$ is the width of one of lower metal portions 1120. In the present implementation, width $W_1$ is small, and lower metal portions 1120 are narrow. In one implementation, width $W_1$ can be a minimum process size. Length $L_1$ is the length of one of lower metal portions 1120. In the present implementation, length $L_1$ is small, and lower metal portions 1120 are short. In one implementation, length $L_1$ can be a multiple of a minimum process size.

Figure 12:
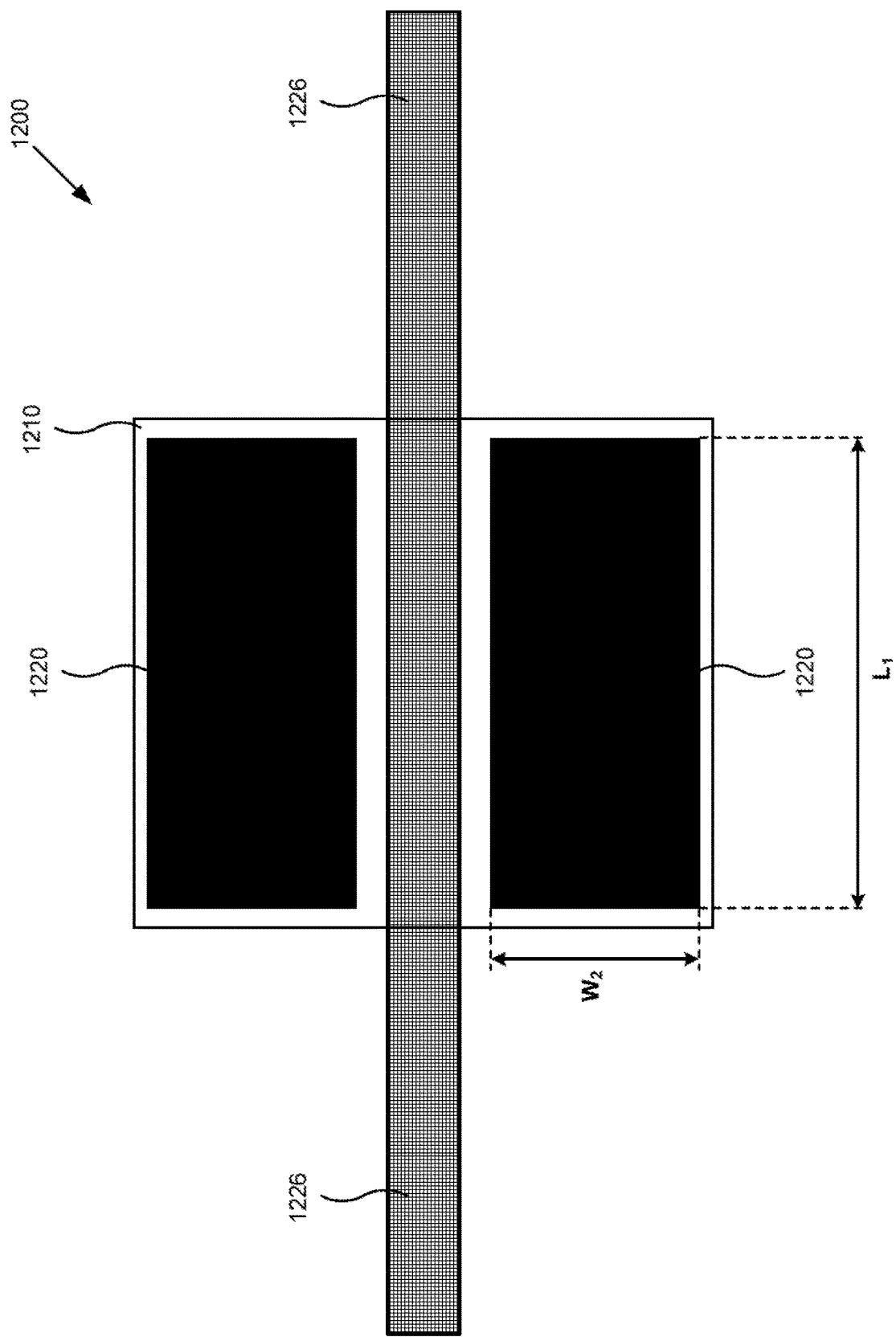
FIG. 12 illustrates a top view of a portion of a wide lower metal portion of a PCM RF switch according to one implementation of the present application.

FIG. 12 illustrates a top view of a portion of a wide lower metal portion RF switch according to one implementation of the present application. PCM RF switch 1200 includes heater line 1226, PCM 1210, and wide lower metal portions 1220 of RF terminals. For purposes of illustration, the top view in FIG. 12 shows selected structures. RF switch 1200 may include other structures not shown in FIG. 12.

Width $W_2$ of wide lower metal portions 1220 in the implementation of FIG. 12 is greater than width $W_1$ of lower metal portions 1120 in the implementation of FIG. 11. Further, the width of PCM 1210 is increased to match the increased width of wide lower metal portions 1220, resulting in an increased area for PCM 1210 relative to PCM 1110. Thus, PCM contact capacitors of RF switch 1200 formed by wide lower metal portions 1220 have greater capacitance values than PCM contact capacitors of RF switch 1100 formed by lower metal portions 1120. That is to say, the capacitance values of a PCM contact capacitors, such as contact capacitors 230 in FIG. 2, are greater in RF switch 1200 than those in RF switch 1100. However, the active segment of PCM 1210 in RF switch 1200 has the same width and length (and thus the same area) as the active segment of PCM 1110 in RF switch 1100. As a result, the capacitance value of PCM capacitor, such as capacitor 284 in FIG. 2, is the same for RF switch 1200 and RF switches 1100.

Figure 13:
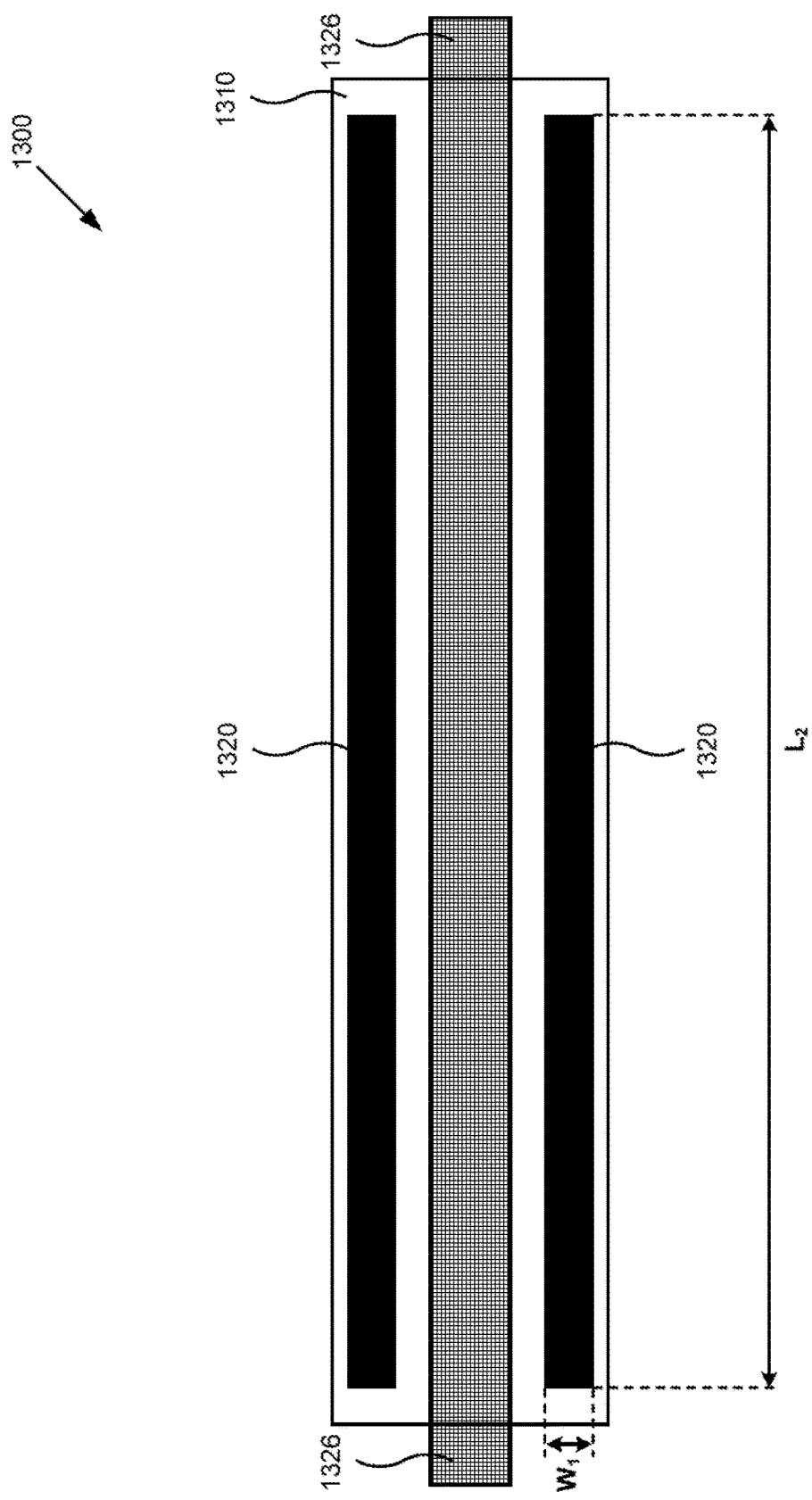
FIG. 13 illustrates a top view of a portion of a long lower metal portion of a PCM RF switch according to one implementation of the present application.

FIG. 13 illustrates a top view of a portion of a long lower metal portion RF switch according to one implementation of the present application. PCM RF switch 1300 includes heater line 1326, PCM 1310, and long lower metal portions 1320 of RF terminals. For purposes of illustration, the top view in FIG. 13 shows selected structures. RF switch 1300 may include other structures not shown in FIG. 13.

Length $L_2$ of long lower metal portions 1320 in the implementation of FIG. 13 is greater than length $L_1$ of lower metal portions 1120 in the implementation of FIG. 11. Further, the length of PCM 1310 is increased to match the increased length of long lower metal portions 1320, resulting in an increased area for PCM 1310 relative to PCM 1110. Thus, PCM contact capacitors of RF switch 1300 formed by wide lower metal portions 1320 have greater capacitance values than PCM contact capacitors of RF switch 1100 formed by lower metal portions 1120. That is to say, the capacitance values of a PCM contact capacitors, such as contact capacitors 230 in FIG. 2, are greater for RF switch 1300 than those in RF switch 1100. Additionally, the active segment of PCM 1310 in RF switch 1300 has a greater length (and thus a greater area) than the active segment of PCM 1110 in RF switch 1100. As a result, the capacitance value of PCM capacitor, such as capacitor 284 in FIG. 2, is greater in RF switch 1300 than those in both RF switches 1100 and 1200.

The top views in FIGS. 11, 12, and 13 illustrate techniques to vary the dimensions of lower metal portions of RF terminals and the PCM area as means to vary capacitance values of the PCM contact capacitors and the PCM capacitors. These techniques are applicable to implementations where lower metal portions are capacitively coupled, such as the implementation of FIG. 2 where lower metal portions 220 are capacitively coupled to passive segments 214, and the implementation of FIG. 4 where lower metal portions 420 are capacitively coupled to upper metal portions 422. It should be understood that in implementations where upper metal portions of RF terminals are capacitively coupled or trench metal liners of RF terminals are capacitively coupled, similar techniques can be applied to vary capacitance values of the PCM contact capacitors and the PCM capacitors.

Figure 14A:
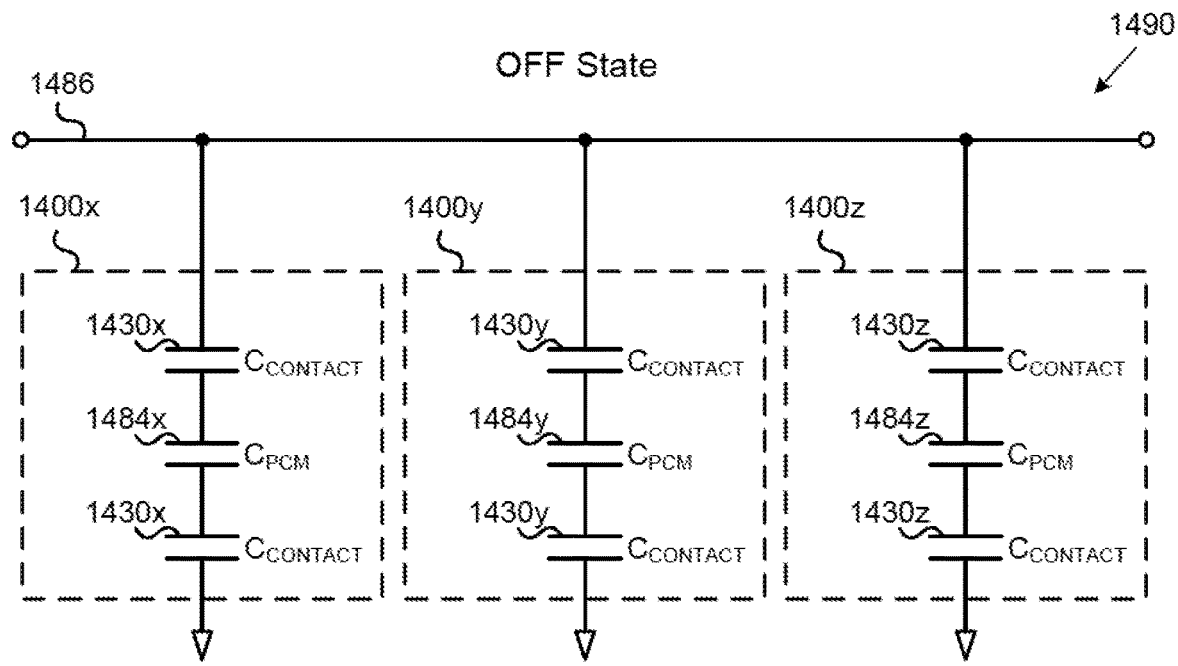
FIG. 14A illustrates a circuit model of a portion of a capacitive tuning circuit including PCM RF switches according to one implementation of the present application.

FIG. 14A illustrates a circuit model of a portion of a capacitive tuning circuit including RF switches according to one implementation of the present application. Capacitive tuning circuit 1490 in FIG. 14A includes RF line 1486 and RF switches 1400x, 1400y, and 1400z coupled between RF line 1486 and ground. PCM RF switches 1400x, 1400y, and 1400z may have any of the implementations or advantages of PCM RF switches described above.

In FIG. 14A, each of RF switches 1400x, 1400y, and 1400z is in an OFF state, and includes PCM contact capacitors and a PCM capacitor in series. Specifically, RF switch 1400x includes PCM contact capacitors 1430x and PCM capacitor 1484x, RF switch 1400y includes PCM contact capacitors 1430y and PCM capacitor 1484y, and RF switch 1400z includes PCM contact capacitors 1430z and PCM capacitor 1484z.

In the present implementation, RF switches 1400x, 1400y, and 1400z have different capacitance values for their PCM contact capacitors. The capacitance values of PCM contact capacitors 1430x, 1430y, and 1430z are modified to be different from each other using the techniques described above. As a first example, RF switch 1400x may be a narrow lower metal portions switch that is shown in FIG. 11, RF switch 1400z may be a wide lower metal portions switch that is shown in FIG. 12, and RF switch 1400y may be a medium-width lower metal portions switch. In this example, the capacitance values of one of PCM contact capacitors 1430x, one of PCM contact capacitors 1430y, and one of PCM contact capacitors 1430z may be about two pico-Farads (2 pF), twenty pico-Farads (20 pF), and two hundred pico-Farads (200 pF) respectively. In this example, the capacitance values of PCM capacitors 1484x. 1484y, and 1484z may be substantially equal, and may each be about one femto-Farad (1 fF).

As a second example, RF switch 1400x may be a short lower metal portions switch that is shown in FIG. 11, RF switch 1400z may be a long lower metal portions switch that is shown in FIG. 13, and RF switch 1400y may be a medium-length lower metal portions switch. In this example, the capacitance values of one of PCM contact capacitors 1430x, one of PCM contact capacitors 1430y, and one of PCM contact capacitors 1430z may again be about two pico-Farads (2 pF), twenty pico-Farads (20 pF), and two hundred pico-Farads (200 pF) respectively. However, in this example, the capacitance values of PCM capacitors 1484x, 1484y, and 1484z may be different. PCM capacitors 1484x, 1484y, and 1484z may be about one femto-Farad (1 fF), ten femto-Farads (10 fF), and one hundred femto-Farads (100 fF) respectively.

When RF switches 1400x, 1400y, and 1400z are in OFF states, capacitive tuning circuit 1490 loads RF line 1486 with an equivalent capacitance value approximately equal to the sum of the values of PCM capacitors 1484x, 1484y, and 1484z. Continuing the first example above, this equivalent capacitance value is approximately three femto-Farads (3 fF). Continuing the second example above, this equivalent capacitance value is approximately one hundred and eleven femto-Farads (111 fF). Thus, in the OFF states, RF switches 1400x, 1400y, and 1400z can use PCM capacitors 1484x, 1484y, and 1484z for fine tuning the capacitive load of capacitive tuning circuit 1490.

Figure 14B:
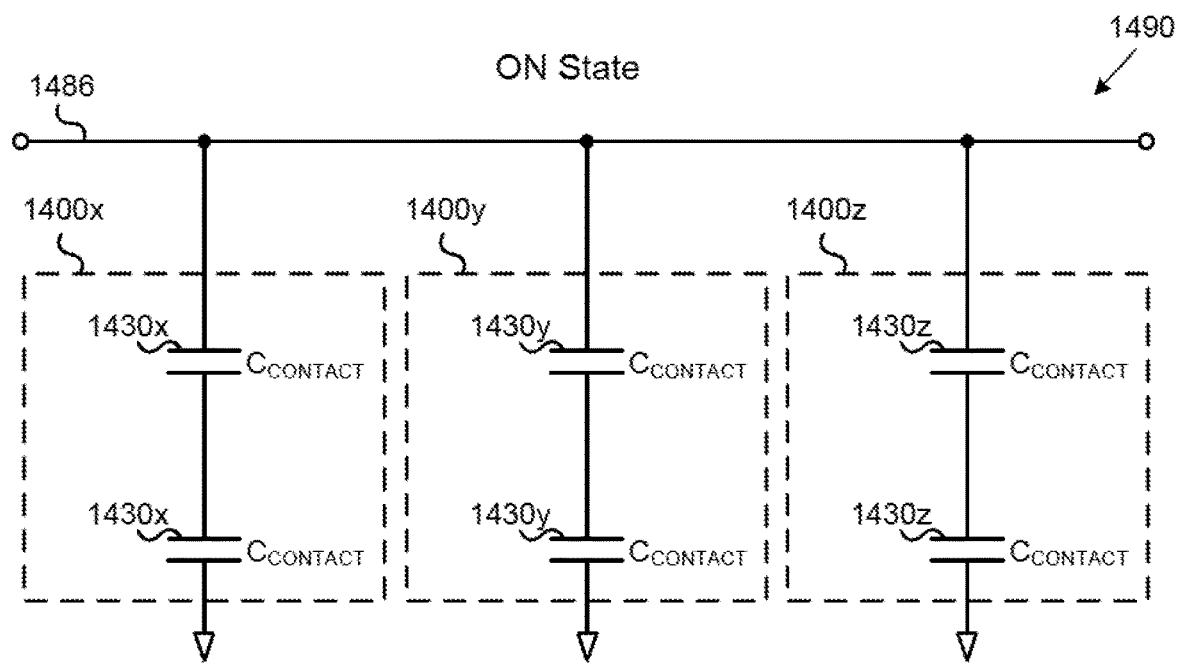
FIG. 14B illustrates a circuit model of a portion of a capacitive tuning circuit including PCM RF switches corresponding to the circuit model of FIG. 14A.

FIG. 14B illustrates a circuit model of a portion of a capacitive tuning circuit including RF switches corresponding to the circuit model of FIG. 14A according to one implementation of the present application. In FIG. 14B, each RF switch 1400x, 1400y, and 1400z is in an ON state, and includes PCM contact capacitors in series. Specifically, RF switch 1400x includes PCM contact capacitors 1430x, RF switch 1400y includes PCM contact capacitors 1430y, and RF switch 1400z includes PCM contact capacitors 1430z. Notably, RF switches 1400x, 1400y, and 1400z in FIG. 14B do not include PCM capacitors, such as PCM capacitors 1484x, 1484y, and 1484z in FIG. 14A. As described above, PCM capacitors 1484x, 1484y, and 1484z are not formed when active segments of PCM are crystalline and RF switches 1400x. 1400y, and 1400z are in ON states.

When RF switches 1400x, 1400y, and 1400z are in ON states, capacitive tuning circuit 1490 loads RF line 1486 with an equivalent capacitance value equal to half the sum of the values of one of PCM capacitors 1484x, one of PCM capacitors 1484y, and one of PCM capacitors 1484z. Continuing the first and second examples above, this equivalent capacitance value is one hundred and eleven pico-Farads (111 pF). Thus, in the ON states, RF switches 1400x, 1400y, and 1400z can use PCM contact capacitors 1430x. 1430y, and 1430z for coarse tuning the capacitive load of capacitive tuning circuit 1490.

Although FIGS. 14A and 14B illustrate examples where all switches are in OFF states and all switches are in ON states, it should be understood that a group of the switches can be in an OFF state and another group of the switches can be in an ON state in any combination, in order to set capacitive tuning circuit 1490 to a desired capacitance value. Continuing the first example above, capacitive tuning circuit 1490 can be set to the following desired capacitance values ($C_{EQ}$) by a group of switches 1400x, 1400y, and 1400z in OFF states and/or ON states as shown in Table (1):

TABLE (1)

| 1400x | 1400y | 1400z | $C_{EQ}$ |
|---|---|---|---|
| ON  | ON  | ON  | 111 pF |
| OFF | ON  | ON  | 110 pF |
| ON  | OFF | ON  | 101 pF |
| OFF | OFF | ON  | 100 pF |
| ON  | ON  | OFF | 11 pF  |
| OFF | ON  | OFF | 10 pF  |
| ON  | OFF | OFF | 1 pF   |
| OFF | OFF | OFF | 3 fF.  |

More combinations and desired capacitance values become available when more switches are introduced and/or the configurations and numbers of branches loading the RF line are modified. Although the present example illustrates a capacitive tuning range from 3 fF to 111 pF, in other implementations, capacitive tuning circuit 1490 can have any other ranges. Step tuning can also be performed where RF switches 1400x, 1400y, and 1400z are similar. For example, where the capacitance value of each of PCM contact capacitors 1430x, 1430y, and 1430z is two pico-Farads (2 pF), capacitive tuning circuit 1490 can be set to desired capacitance values of approximately two, four, or six pico-Farads (2 pF, 4 pF, or 6 pF). Step tuning achieves more even increments between desired capacitance values, but generally requires more switches to achieve a wide range that spans orders of magnitude. Advantageously, capacitive tuning circuit 1490 enables tuning across a wide range because it employs PCM RF switches 1400x, 1400y, and 1400z that represent PCM capacitors 1484x, 1484y, and 1484z in the OFF state which are significantly smaller (often orders of magnitude smaller) than PCM contact capacitors 1430x. 1430y, and 1430z represented in the ON state. Further, capacitive tuning circuit 1490 can be set to the desired capacitance value in this wide range in a non-volatile manner. Also, the desired capacitance value does not vary over time. And below a crystallization temperature of PCM, for example, below two hundred degrees Celsius (200° C.), the desired capacitance value does not vary with temperature.

Thus, various implementations of the present application achieve capacitive tuning circuits that allow non-volatile coarse and fine adjustments over a wide range of capacitances. From the above description it is manifest that various techniques can be used for implementing the concepts described in the present application without departing from the scope of those concepts. For example, a single PCM contact capacitor can be formed in the RF path near one RF terminal, while the other RF terminal only employs ohmic connections. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A capacitive tuning circuit for capacitive loading of an RF line, said capacitive tuning circuit comprising:
  RF switches connected to said RF line, each of said RF switches including:
    a phase-change material (PCM) and a heating element underlying an active segment of said PCM and extending outward and transverse to said PCM;
    RF terminals comprising lower metal portions and upper metal portions, said RF terminals being coupled to said RF line;
    at least one of said lower metal portions of said RF terminals being ohmically separated from and capacitively coupled to passive segments of said PCM;
    said upper metal portions of said RF terminals being ohmically connected to said lower metal portions of said RF terminals;
  said capacitive tuning circuit being set to a desired capacitance value when a first group of said RF switches is in an OFF state and a second group of said RF switches is in an ON state.

2. The capacitive tuning circuit of claim 1, wherein each RF switch in said OFF state represents a PCM capacitor that is utilized for fine tuning said capacitive tuning circuit.

3. The capacitive tuning circuit of claim 2, wherein said PCM capacitor is formed by an amorphized active segment of said PCM and said passive segments of said PCM.

4. The capacitive tuning circuit of claim 2, wherein each RF switch in said ON state represents a PCM contact capacitor that is utilized for coarse tuning said capacitive tuning circuit.

5. The capacitive tuning circuit of claim 4, wherein said PCM contact capacitor is formed by said passive segments of said PCM, an RF terminal dielectric segment, and said lower metal portions of said RF terminals.

6. The capacitive tuning circuit of claim 5, wherein said PCM contact capacitor is at least one order of magnitude greater than said PCM capacitor.

7. The RF switch of claim 1, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

8. A capacitive tuning circuit for capacitive loading of an RF line, said capacitive tuning circuit comprising:
  RF switches connected to said RF line, each of said RF switches including:
    a phase-change material (PCM) and a heating element underlying an active segment of said PCM and extending outward and transverse to said PCM;
    RF terminals comprising lower metal portions and upper metal portions;
    said lower metal portions of said RF terminals being ohmically connected to passive segments of said PCM;
    said upper metal portions of said RF terminals made from a first interconnect metal, wherein at least one of said upper metal portions of said RF terminals is capacitively coupled by a capacitor formed in part by said first interconnect metal;
  said capacitive tuning circuit being set to a desired capacitance value when a first group of said RF switches is in an OFF state and a second group of said RF switches is in an ON state.

9. The capacitive tuning circuit of claim 8, wherein said upper metal portions of said RF terminals are ohmically separated from and capacitively coupled to said lower metal portions of said RF terminals.

10. The capacitive tuning circuit of claim 8, wherein each RF switch in said OFF state represents a PCM capacitor that is utilized for fine tuning said capacitive tuning circuit.

11. The capacitive tuning circuit of claim 10, wherein said PCM capacitor is formed by an amorphized active segment of said PCM and said passive segments of said PCM.

12. The capacitive tuning circuit of claim 10, wherein each RF switch in said ON state represents a PCM contact capacitor that is utilized for coarse tuning said capacitive tuning circuit.

13. The capacitive tuning circuit of claim 12, wherein said PCM contact capacitor is a MOM capacitor formed by said lower metal portion, a pre-metal dielectric, and said first interconnect metal.

14. The capacitive tuning circuit of claim 12, wherein said PCM contact capacitor is at least one order of magnitude greater than said PCM capacitor.

15. The capacitive tuning circuit of claim 8, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

16. A capacitive tuning circuit for capacitive loading of an RF line, said capacitive tuning circuit comprising:
   RF switches connected to said RF line, each of said RF switches including:
   a phase-change material (PCM) and a heating element underlying an active segment of said PCM and extending outward and transverse to said PCM;
   RF terminals comprising a trench metal liner separated from a trench metal plug by a dielectric liner;
   said trench metal liner of said RF terminals being ohmically connected to passive segments of said PCM;
   said trench metal plug of at least one of said RF terminals being ohmically separated from and capacitively coupled to said trench metal liner of said RF terminals;
   said capacitive tuning circuit being set to a desired capacitance value when a first group of said RF switches is in an OFF state and a second group of said RF switches is in an ON state.

17. The capacitive tuning circuit of claim 16, wherein each RF switch in said OFF state represents a PCM capacitor that is utilized for fine tuning said capacitive tuning circuit.

18. The capacitive tuning circuit of claim 17, wherein said PCM capacitor is formed by an amorphized active segment of said PCM and said passive segments of said PCM.

19. The capacitive tuning circuit of claim 17, wherein each RF switch in said ON state represents a PCM contact capacitor that is utilized for coarse tuning said capacitive tuning circuit.

20. The capacitive tuning circuit of claim 19, wherein said PCM contact capacitor is a trench capacitor formed by said trench metal plug of said RF terminals, said dielectric liner, and said trench metal liner of said RF terminals.

\* \* \* \* \*